US009689942B2

(12) United States Patent
Morgan et al.

(10) Patent No.: US 9,689,942 B2
(45) Date of Patent: Jun. 27, 2017

(54) QUANTITATIVE NMR CLINICAL ANALYZERS WITH AUTOMATIC NMR TEMPERATURE SENSITIVITY COMPENSATION THAT ACCOMMODATE LARGE AMBIENT OPERATIONAL TEMPERATURE RANGES

(75) Inventors: David R. Morgan, Raleigh, NC (US); Elias J. Jeyarajah, Raleigh, NC (US)

(73) Assignee: LipoScience, Inc., Raleigh, NC (US)

( * ) Notice: Subject to any disclaimer, the term of this patent is extended or adjusted under 35 U.S.C. 154(b) by 1303 days.

(21) Appl. No.: 13/534,609

(22) Filed: Jun. 27, 2012

(65) Prior Publication Data

US 2013/0002250 A1    Jan. 3, 2013

Related U.S. Application Data

(60) Provisional application No. 61/502,965, filed on Jun. 30, 2011.

(51) Int. Cl.
| | | |
|---|---|---|
| *G01V 3/00* | (2006.01) | |
| *G01R 33/46* | (2006.01) | |
| *G01R 33/465* | (2006.01) | |
| *G01R 33/31* | (2006.01) | |

(52) U.S. Cl.
CPC .......... *G01R 33/46* (2013.01); *G01R 33/465* (2013.01); *G01R 33/31* (2013.01)

(58) Field of Classification Search
CPC .................................................... G01R 33/31
USPC ................................. 324/315, 309, 307, 322
See application file for complete search history.

(56) References Cited

U.S. PATENT DOCUMENTS

| | | | |
|---|---|---|---|
| 4,595,878 A | 6/1986 | Bradshaw | |
| 5,122,746 A | 6/1992 | King et al. | |
| 6,252,405 B1 * | 6/2001 | Watkins | G01R 33/389 324/315 |
| 6,518,069 B1 | 2/2003 | Otvos et al. | |
| 6,731,113 B2 * | 5/2004 | Ham | G01R 33/56563 324/309 |
| 7,602,185 B2 * | 10/2009 | Nozaki | G01R 33/3856 324/309 |
| 8,013,602 B2 * | 9/2011 | Otvos | G01R 33/307 324/307 |

(Continued)

OTHER PUBLICATIONS

Bowyer et al., Analyzing and Correcting Spectrometer Temperature Sensitivity, Journal of Magnetic Resonance, vol. 152, pp. 234-246, 2001.

(Continued)

*Primary Examiner* — Louis Arana
(74) *Attorney, Agent, or Firm* — Kilpatrick Townsend & Stockton LLP

(57) ABSTRACT

NMR analyzers and associated methods, circuits and computer program products that allow NMR operation in fluctuating ambient temperature environments of at least +/−5 degrees F. in a relatively large operating temperature range, typically between about 60-85 degrees F.) with the ability to still generate accurate quantitative measurements using an electronically applied temperature sensitivity adjustment based on an a priori model of temperature sensitivity and a detected temperature proximate the NMR signal acquisition (e.g., scan). The clinical NMR analyzers can be remotely accessed to evaluate linearity and temperature compensation adjustments.

20 Claims, 21 Drawing Sheets

(56) References Cited

U.S. PATENT DOCUMENTS

| | | | |
|---|---|---|---|
| 8,723,523 B2* | 5/2014 | Tsuda | G01R 33/3806 |
| | | | 324/309 |
| 2005/0242811 A1 | 11/2005 | Schaepman et al. | |
| 2008/0309339 A1 | 12/2008 | Chisholm et al. | |
| 2010/0023275 A1 | 1/2010 | Trygstad | |
| 2010/0100334 A1 | 4/2010 | Otvos | |

OTHER PUBLICATIONS

Farrant et al., NMR quantification using an artificial signal, Magnetic Resonance in Chemistry, vol. 48, pp. 753-762, Aug. 2010.

Agilet Technologies, DD2 NMR/MRI Console, PowerPoint presentation, disclosed/public on or about Apr. 9, 2011, 24 pages, Agilent, Santa Clara, CA.

International Search Report and Written Opinion for corresponding PCT Application No. PCT/US2012/044392, Date of Mailing Jan. 24, 2013.

European Patent Office, Extended European Search Report, European Application No. 12805191.9 dated Jul. 10, 2015.

State Intellectual Property Office, P.R. China, Second Office Action, Application No. 201280042261 dated Apr. 5, 2016.

Australian Patent Office, Patent Examination Report No. 1, Application No. 2012275478 dated Feb. 24, 2014.

Australian Patent Office, Patent Examination Report No. 2, Application No. 2012275478 dated Nov. 11, 2014.

* cited by examiner

LDL-P (nmol/L) VS. TEMPERATURE AT LOW HUMIDITY

| HUMIDITY 15% | TARGET TEMPERATURE | 60 °F | 65 °F | 70 °F | 75 °F | 80 °F | 85 °F |
|---|---|---|---|---|---|---|---|
| 1673L1 (TARGET CV < 6%) | N | 20 | 20 | 20 | 20 | 20 | 20 |
| | MEAN | 878.8 | 911.3 | 980.3 | 979.5 | 951.4 | 922.8 |
| | SD | 33.83 | 43.73 | 45.82 | 40.64 | 59.15 | 48.09 |
| | 95% CI | 25.73-49.41 | 33.25-63.87 | 34.85-66.92 | 30.90-59.35 | 44.98-86.39 | 36.57-70.23 |
| | %CV | 3.9 | 4.8 | 4.7 | 4.1 | 6.2 | 5.2 |
| 1673L2 (TARGET CV < 5%) | N | 20 | 20 | 20 | 20 | 20 | 20 |
| | MEAN | 1966.1 | 2004.7 | 2078.7 | 2165.4 | 2099.6 | 2131.8 |
| | SD | 67.89 | 96.94 | 72.30 | 50.05 | 90.63 | 68.16 |
| | 95% CI | 51.63-99.16 | 73.72-141.59 | 54.99-105.61 | 38.06-73.10 | 68.93-132.38 | 51.83-99.55 |
| | %CV | 3.5 | 4.8 | 3.5 | 2.3 | 4.3 | 3.2 |

FIG. 12A

LDL-P (nmol/L) VS. TEMPERATURE AT HIGH HUMIDITY

| HUMIDITY 80% | TARGET TEMPERATURE | 60 °F | 65 °F | 70 °F | 75 °F | 80 °F | 85 °F |
|---|---|---|---|---|---|---|---|
| 1673L1 (TARGET CV < 6%) | N | 20 | 20 | 20 | 20 | 20 | 20 |
| | MEAN | 862.4 | 900.4 | 917.5 | 921.8 | 926.1 | 966.0 |
| | SD | 42.78 | 34.88 | 46.18 | 45.29 | 51.30 | 43.55 |
| | 95% CI | 32.53-62.48 | 26.53-50.95 | 35.12-67.45 | 34.44-66.15 | 39.01-74.92 | 33.12-63.60 |
| | %CV | 5.0 | 3.9 | 5.0 | 4.9 | 5.5 | 4.5 |
| 1673L2 (TARGET CV < 5%) | N | 20 | 20 | 20 | 20 | 20 | 20 |
| | MEAN | 1922.6 | 1989.4 | 1995.3 | 2030.6 | 2012.4 | 2138.2 |
| | SD | 70.33 | 48.34 | 58.40 | 58.35 | 60.85 | 66.00 |
| | 95% CI | 53.48-102.72 | 36.76-70.61 | 44.42-85.30 | 44.38-85.23 | 46.27-88.87 | 50.19-96.40 |
| | %CV | 3.7 | 2.4 | 2.9 | 2.9 | 3.0 | 3.1 |

FIG. 12B

HDL-P (μmol/L) VS. TEMPERATURE AT LOW HUMIDITY

| HUMIDITY 15% | TARGET TEMPERATURE | 60 °F | 65 °F | 70 °F | 75 °F | 80 °F | 85 °F |
|---|---|---|---|---|---|---|---|
| I673L1 (TARGET CV < 4%) | N | 20 | 20 | 20 | 20 | 20 | 20 |
| | MEAN | 26.72 | 27.34 | 28.49 | 29.05 | 28.88 | 28.18 |
| | SD | 0.689 | 0.571 | 0.488 | 0.712 | 0.535 | 0.423 |
| | 95% CI | 0.524-1.007 | 0.434-0.833 | 0.371-0.712 | 0.541-1.040 | 0.407-0.781 | 0.322-0.618 |
| | %CV | 2.6 | 2.1 | 1.7 | 2.5 | 1.9 | 1.5 |
| I673L2 (TARGET CV < 4%) | N | 20 | 20 | 20 | 20 | 20 | 20 |
| | MEAN | 36.12 | 36.60 | 37.96 | 39.21 | 38.92 | 38.50 |
| | SD | 0.723 | 1.063 | 0.948 | 0.656 | 0.677 | 0.850 |
| | 95% CI | 0.550-1.056 | 0.809-1.553 | 0.721-1.384 | 0.499-0.958 | 0.515-0.989 | 0.646-1.242 |
| | %CV | 2.0 | 2.9 | 2.5 | 1.7 | 1.7 | 2.2 |

FIG. 13A

HDL-P (μmol/L) VS. TEMPERATURE AT HIGH HUMIDITY

| HUMIDITY 80% | TARGET TEMPERATURE | 60 °F | 65 °F | 70 °F | 75 °F | 80 °F | 85 °F |
|---|---|---|---|---|---|---|---|
| I673L1 (TARGET CV < 4%) | N | 20 | 20 | 20 | 20 | 20 | 20 |
| | MEAN | 26.47 | 26.98 | 27.75 | 28.20 | 28.57 | 29.22 |
| | SD | 0.281 | 0.361 | 0.459 | 0.342 | 0.360 | 0.406 |
| | 95% CI | 0.214-0.411 | 0.275-0.527 | 0.349-0.671 | 0.260-0.499 | 0.274-0.526 | 0.309-0.593 |
| | %CV | 1.1 | 1.3 | 1.7 | 1.2 | 1.3 | 1.4 |
| I673L2 (TARGET CV < 4%) | N | 20 | 20 | 20 | 20 | 20 | 20 |
| | MEAN | 35.70 | 36.32 | 37.17 | 37.49 | 37.92 | 40.08 |
| | SD | 0.395 | 0.467 | 0.678 | 0.626 | 0.770 | 0.589 |
| | 95% CI | 0.301-0.577 | 0.355-0.682 | 0.515-0.990 | 0.476-0.914 | 0.585-1.124 | 0.448-0.860 |
| | %CV | 1.1 | 1.3 | 1.8 | 1.7 | 2.0 | 1.5 |

FIG. 13B

LDL-P (nmol/L) %BIAS VS. TEMPERATURE (LOW HUMIDITY)

| CONTROL LEVEL | TEMPERATURE (°F) | MEAN | %BIAS OF MEAN VS. 75 °F | REGRESSION %BIAS VS. 77 °F |
|---|---|---|---|---|
| 1673L1 | 60 | 878.8 | -10.3% | -11.2% |
|  | 65 | 911.3 | -7.0% | -4.7% |
|  | 70 | 980.3 | 0.1% | -0.9% |
|  | 75 | 979.5 | N/A | 0.3% |
|  | 80 | 951.4 | -2.9% | -1.2% |
|  | 85 | 922.8 | -5.8% | -5.3% |
| 1673L2 | 60 | 1966.1 | -9.2% | -8.7% |
|  | 65 | 2004.7 | -7.4% | -4.8% |
|  | 70 | 2078.7 | -4.0% | -2.0% |
|  | 75 | 2165.4 | N/A | -0.3% |
|  | 80 | 2099.6 | -3.0% | 0.2% |
|  | 85 | 2131.8 | -1.6% | -0.4% |

FIG. 18A

LDL-P (nmol/L) %BIAS VS. TEMPERATURE (HIGH HUMIDITY)

| CONTROL LEVEL | TEMPERATURE (°F) | MEAN | %BIAS OF MEAN VS. 75 °F | REGRESSION %BIAS VS. 77 °F |
|---|---|---|---|---|
| 1673L1 | 60 | 862.4 | -6.4% | -6.4% |
|  | 65 | 900.4 | -2.3% | -4.5% |
|  | 70 | 917.5 | -0.5% | -2.6% |
|  | 75 | 921.8 | N/A | -0.8% |
|  | 80 | 926.1 | 0.5% | 1.1% |
|  | 85 | 966.0 | 4.8% | 3.0% |
| 1673L2 | 60 | 1922.6 | -5.3% | -5.9% |
|  | 65 | 1989.4 | -2.0% | -4.1% |
|  | 70 | 1995.3 | -1.7% | -2.4% |
|  | 75 | 2030.6 | N/A | -0.7% |
|  | 80 | 2012.4 | -0.9% | 1.0% |
|  | 85 | 2138.2 | 5.3% | 2.8% |

FIG. 18B

HDL-P (μmol/L) %BIAS VS. TEMPERATURE (LOW HUMIDITY)

| CONTROL LEVEL | TEMPERATURE (°F) | MEAN | %BIAS OF MEAN VS. 75 °F | REGRESSION %BIAS VS. 77 °F |
|---|---|---|---|---|
| 1673L1 | 60 | 26.72 | -8.0% | -8.7% |
| | 65 | 27.34 | -5.9% | -4.3% |
| | 70 | 28.49 | -1.9% | -1.4% |
| | 75 | 29.05 | N/A | -0.1% |
| | 80 | 28.88 | -0.6% | -0.3% |
| | 85 | 28.18 | -3.0% | -2.0% |
| 1673L2 | 60 | 36.12 | -7.9% | -8.2% |
| | 65 | 36.60 | -6.7% | -4.5% |
| | 70 | 37.96 | -3.2% | -1.9% |
| | 75 | 39.21 | N/A | -0.3% |
| | 80 | 38.92 | -0.7% | 0.1% |
| | 85 | 38.50 | -1.8% | -0.5% |

FIG. 19A

HDL-P (μmol/L) %BIAS VS. TEMPERATURE (HIGH HUMIDITY)

| CONTROL LEVEL | TEMPERATURE (°F) | MEAN | %BIAS OF MEAN VS. 75 °F | REGRESSION %BIAS VS. 77 °F |
|---|---|---|---|---|
| 1673L1 | 60 | 26.47 | -6.1% | -6.5% |
| | 65 | 26.98 | -4.3% | -4.6% |
| | 70 | 27.75 | -1.6% | -2.7% |
| | 75 | 28.20 | N/A | -0.8% |
| | 80 | 28.57 | 1.3% | 1.1% |
| | 85 | 29.22 | 3.6% | 3.1% |
| 1673L2 | 60 | 35.70 | -4.8% | -7.0% |
| | 65 | 36.32 | -3.1% | -5.0% |
| | 70 | 37.17 | -0.9% | -2.9% |
| | 75 | 37.49 | N/A | -0.8% |
| | 80 | 37.92 | 1.1% | 1.2% |
| | 85 | 40.08 | 6.9% | 3.3% |

FIG. 19B

QUANTITATIVE NMR CLINICAL ANALYZERS WITH AUTOMATIC NMR TEMPERATURE SENSITIVITY COMPENSATION THAT ACCOMMODATE LARGE AMBIENT OPERATIONAL TEMPERATURE RANGES

RELATED APPLICATIONS

This application claims the benefit of and priority to U.S. Provisional Patent Application Ser. No. 61/502,965, filed Jun. 30, 2011, the contents of which are hereby incorporated by reference as if recited in full herein.

FIELD OF THE INVENTION

The present invention relates generally to NMR systems and may be particularly suitable for NMR in vitro systems capable of quantitatively analyzing biosamples.

BACKGROUND OF THE INVENTION

NMR clinical analyzers have been used by LipoScience, Inc., located in Raleigh, N.C., to generate quantitative measurements of biosamples that assess a patient's risk of coronary artery disease ("CAD") and/or diabetes using NMR-derived (quantitative analysis) lipoprotein measurements. U.S. Patent Application Publication No. US2005/0222504 describes exemplary NMR clinical analyzers. U.S. Pat. No. 6,518,069 describes examples of Type II diabetes risk assessments and NMR glucose measurements. U.S. Patent Application Publication No. US2010/0100334 describes Lipoprotein Insulin Resistance Indexes that may also be useful for assessing a risk of developing diabetes. The contents of the above-referenced patents and patent application publications are hereby incorporated by reference as if recited in full herein.

It is well known that NMR analyzers are temperature sensitive. Ambient temperature fluctuation can result in unreliable quantitative measurements. In the past, NMR analyzers, particularly those used for quantitative measurements, were required to be kept in rooms with controlled temperatures, typically controlled to be within about +/−one (1) degree Celsius, to address this problem. Indeed, the two largest NMR spectrometer manufacturers (Agilent Technologies, Inc. and Bruker BioSpin Corp.) state in their site operational manuals that while the instruments can operate from 17-24 degrees C., for optimal performance the room temperature must be regulated, e.g., the room temperature should be maintained to within +/−1 degree C. This tight temperature control is often maintained in dedicated NMR labs but it is not common in clinical labs such as those in hospitals or commercial lab environments, as many commercial or clinical laboratory environments can fluctuate in temperature in different zones and/or over time. The change in temperature affects the sensitivity and phase performance of NMR instrument and can therefore negatively affect the accuracy of a quantitative measurement.

Thus, there is a need for NMR clinical analyzers that can operate in environments that may fluctuate in ambient temperature over time (e.g., hourly, daily, weekly, monthly and the like) and/or vary over a wide range of temperatures and still generate accurate quantitative measurements.

SUMMARY OF EMBODIMENTS OF THE INVENTION

Embodiments of the invention are directed to automated temperature sensitivity adjustments for NMR analyzers. The adjustments vary based on temperature. The adjustments are electronically applied to obtained NMR signals to account for temperature variation in ambient temperatures at the time of signal acquisition.

The NMR analyzers can operate at temperatures over a defined temperature range that is at least between about 63-75 degrees F. (17-24 degrees C.), and typically between about 60-85 degrees F., allowing for fluctuation within and/or over the defined temperature range, and still provide for accurate NMR spectrometer measurements to thereby allow for operation in a wide range of ambient temperature environments.

In some embodiments, the NMR analyzers can operate at ambient room temperatures over a large range of about 60-85 degrees F. (about 16-29 degrees C.) while generating accurate NMR measurements (typically +/−2% or better).

In some embodiments, the NMR analyzers can electronically apply a temperature correction adjustment, which varies with ambient temperature based on a monitored on-board temperature, to an obtained NMR signal based on a pre-defined linear or non-linear model of signal intensity versus temperature (thus not requiring the use of an internal calibration standard or artificial signal for each NMR signal acquisition).

Some embodiments are directed to methods of operating an NMR analyzer. The methods include: (a) placing a sample in a bore of an NMR spectrometer; (b) electronically obtaining NMR signal associated with the sample from an NMR probe held in the bore of an NMR spectrometer; (c) electronically detecting at least one temperature at a location that is (i) on-board the NMR analyzer and/or (ii) in a room holding the NMR analyzer proximate in time to the obtaining step; then (d) electronically correcting the obtained signal using a temperature sensitivity correction factor that is selected based on the detected temperature and a model of NMR signal temperature sensitivity; and (e) generating a quantitative measurement of a sample using the corrected obtained signal.

The electronically detecting can be carried out using a temperature sensor that resides in an NMR console of the NMR analyzer, and wherein the electronically detecting step is carried out to detect a plurality of temperatures during the obtaining step.

The model can be a linear or non-linear model of a concentration standard over a defined temperature range that provides NMR signal intensity adjustment that varies as ambient temperature varies thereby allowing for fluctuating ambient temperatures over at least 5 degrees F. (3 degrees C.) within the defined ambient temperature range.

The temperature sensitivity correction factor can include a non-temperature sensitive instrument normalization correction factor to thereby normalize measurements taken over a plurality of different NMR analyzers.

The electronically detecting can be carried out using at least one temperature sensor that is on-board the NMR analyzer proximate a mixer box.

The model can be generated using a standard model of temperature sensitivity based on measurements of a plurality of different NMR consoles or portions thereof obtained by measuring temperature versus peak values of standard signal integrals over a defined temperature range, with the signal values at defined temperatures over the temperature range being averaged to generate the standard model with a slope.

The temperature sensitivity measurements can be carried out while the NMR analyzers are held in a temperature controlled environment and exposed to temperatures over a defined temperature range.

Data for the model can be generated at a use site of a respective NMR analyzer to define an instrument specific slope.

The model can be validated and/or generated, at least in-part, at a use site using a small ambient temperature range that is a sub-range of a defined larger acceptable ambient temperature operating range.

The obtaining can be carried out when the NMR analyzer is in a room having an ambient temperature range of between about 63 degrees Fahrenheit ("F") (about 17 degrees Celsius) to about 75 degrees F. (about 24 degrees C.) with temperatures that can fluctuate at least about +/−5 degrees F. (3 degrees C.) within the temperature range, and wherein the generating step generates quantitative measurements with +/−2% accuracy as measured by a trimethyl acetic acid (TMA) control.

The sample can be a human blood serum or plasma biosample and the obtaining can be carried out when the NMR analyzer is in a room having an ambient temperature range of between about 60-85 degrees Fahrenheit ("F") (between about 16 degrees Celsius to about 29 degrees C.) with temperatures that can fluctuate at least about +/−5 degrees F. (3 degrees C.) within the temperature range. The generating step can generate quantitative measurements with +/−10% accuracy of lipoproteins in the biosample.

The model can be a linear model and can have a negative slope. The correcting can be carried out using the slope to calculate the adjustment factor. The detected temperature can include a temperature in a mixer region on-board the NMR analyzer which correlates to an ambient temperature that is between about 10-15 degrees below the on-board detected mixer temperature.

The obtaining can be carried out when the NMR analyzer is in a room having an ambient temperature range of between about 60 degrees F. (17 degrees C.) to at least about 80 degrees F. (27 degrees C.) with temperatures that can fluctuate at least about +/−10 degrees F. (8 degrees C.).

The sample can be a biosample and the generating can generate quantitative measurements for at least one target analyte in the biosample with about +/−10% accuracy over a temperature range of 60-85 degrees F.

The sample can be a human blood serum or plasma biosample and the generating can generate a clinically acceptable quantitative measurement for at least one target analyte in the biosample over a temperature range of between about 60-85 degrees F.

The sample can be a human urine biosample and the generating can generate a clinically acceptable quantitative measurement for at least one target analyte in the biosample over a temperature range of between about 60-85 degrees F.

Other embodiments are directed to NMR analyzers. The analyzers include: (a) an NMR console; (b) at least one temperature sensor onboard or proximate the NMR console; and (c) at least one processor in communication with the NMR console configured to apply a post-signal collection temperature sensitivity correction to signal data in communication with or onboard the analyzer. The at least one processor is configured to adjust NMR signal intensity associated with a sample undergoing analysis using a correction factor that varies with increasing and decreasing ambient temperature based on (i) temperature data from the at least one temperature sensor and (ii) a model of temperature sensitivity of NMR signal intensity over a defined ambient temperature range that is between at least about 63 degrees F. (17 degrees C.) to at least about 75 degrees F. (about 24 degrees C.). The at least one processor is configured to generate quantitative measurements using the temperature data and the model allowing for fluctuating ambient external temperatures of at least about 5 degrees F. (about 3 degrees C.) proximate the NMR analyzer within the defined ambient temperature range.

The at least one processor can be configured to generate quantitative measurements that are accurate to within about +/−2% over the defined temperature range, as measured by a trimethyl acetic acid (TMA) control sample.

The at least one temperature sensor can include a sensor that resides proximate a mixer box in the NMR console.

The post-signal collection sensitivity correction can allow for ambient temperature fluctuation of at least 12 degrees F. (7 degrees C.) within the defined ambient temperature range.

The NMR analyzer can be configured to analyze biosamples and the at least one processor can generate a quantitative measurement of at least one target analyte in a respective biosample that is accurate to within about +−10%.

The model can be an analyzer-specific model.

The model can be a linear or polynomial standardized model used for a plurality of different NMR analyzers.

The model can be based on data from in situ temperature versus signal measurements taken over a subset of the defined ambient temperature range at a field use site at installation.

The NMR analyzer can be configured to evaluate at least one target analyte in at least one type of biosample, wherein the NMR console can operate in an environment having a temperature range of between about 60-85 degrees F. while allowing for temperature fluctuations of at least 10 degrees. The at least one processor can be configured to apply the post-signal correction to generate clinical quantitative measurements using NMR signal obtained at temperatures in the temperature range.

The NMR analyzer can be configured to evaluate a plurality of analytes in a human blood plasma or serum biosample, wherein the NMR console can operate in an environment having a temperature range of between about 60-85 degrees F. while allowing for temperature fluctuations of at least 10 degrees. The at least one processor can be configured to apply the post-signal correction to generate clinical quantitative measurements to NMR signal obtained at temperatures in the temperature range.

The at least one processor can generate measurements of a plurality of target analytes in respective biosamples that have +/−10% accuracy using NMR signal from the NMR analyzer that operates within about a 60-85 degree F. temperature range.

The NMR analyzer can be configured to evaluate a plurality of analytes in a urine biosample. The NMR console can operate in an environment having a temperature range of between about 60-85 degrees F. while allowing for temperature fluctuations of at least 10 degrees. The at least one processor is configured to apply the post-signal correction to generate quantitative measurements to NMR signal obtained at temperatures in the temperature range.

Yet other embodiments are directed to circuits that include at least one processor configured to compensate for temperature sensitivity of at least one NMR analyzer. The circuit is configured to adjust NMR signal intensity of a respective NMR analyzer associated with a biosample undergoing analysis based on (i) a detected temperature onboard the NMR console proximate in time to the analysis and (ii) at least one model of temperature sensitivity of NMR signal intensity over a defined ambient temperature range of between at least about 63 degrees F. (at least about 17 degrees C.) to at least about 75 degrees F. (about 24 degrees C.). The circuit is configured to generate quantitative measurements using the detected temperature and the at least one model of temperature sensitivity allowing for fluctuating ambient temperatures in an environment about the NMR analyzer over the entire defined ambient temperature range.

The at least one processor can be in communication with at least one NMR detector and the at least one processor can generate quantitative measurements that are accurate to within about +/−10% over the defined ambient temperature range using the at least one model. The at least one processor can select either a linear or non-linear predefined model to apply a temperature sensitivity correction factor to adjust the NMR signal intensity.

The at least one processor can be in communication with at least one NMR detector and the at least one processor can generate quantitative measurements of at least one target analyte in respective biosamples that are accurate to within about +/−2% over the defined ambient temperature range as evaluated using a trimethyl acetic acid (TMA) control.

Still other embodiments are directed to processors configured to adjust obtained NMR signal using data from at least one defined model of temperature sensitivity of at least one NMR analyzer. The at least one model represents signal intensity versus temperature of a standard over a defined temperature range between at least about 63 degrees F. (17 degrees C.) and at least about 75 degrees F. (24 degrees C.), wherein the NMR signal intensity adjustment varies as ambient temperature varies thereby allowing for fluctuating ambient temperatures over at least 5 degrees F. (3 degrees C.) within the defined ambient temperature range.

The processor can be configured to apply a selected post-collection temperature sensitivity correction to NMR signal data for NMR signal data collected over a temperature range between about 60-85 degrees F. based on a temperature detected proximate a time of signal acquisition, and the model can be a defined linear and/or non-linear model.

Additional embodiments are directed to computer program products for adjusting NMR signal intensity to compensate for temperature sensitivity of an NMR analyzer. The computer program product includes a non-transitory computer readable storage medium having computer readable program code embodied in the medium. The computer-readable program code including: (a) computer readable program code configured to adjust NMR signal intensity associated with a biosample undergoing analysis for temperature sensitivity based on (i) a temperature associated with at least one internal location inside the NMR analyzer or at least one external ambient location associated with the NMR analyzer proximate in time to signal acquisition of a respective biosample and (ii) a model of temperature sensitivity of NMR signal intensity over a defined ambient temperature range of between at least about 63 degrees F. (17 degrees C.) to at least about 75 degrees F. (24 degrees C.). The NMR signal intensity adjustment varies as ambient temperature varies thereby allowing for fluctuating ambient temperatures over at least 5 degrees F. (3 degrees C.) within the defined ambient temperature range. The computer program product also includes (c) computer readable program code configured to generate quantitative measurements using the adjusted NMR signal intensity.

The computer readable code that generates the measurements can be configured to generate clinical measurements of at least one target analyte in respective biosamples.

The measurements can be accurate to within +/−10%, and wherein the target analytes include lipoproteins.

The defined temperature range can be between about 60-85 degrees F. and the measurements can be of lipoproteins in human blood plasma or serum biosample.

The computer program code that adjusts the NMR signal intensity can generate measurements that are accurate to within about +/−2%, as evaluated using a trimethyl acetic acid (TMA) control over a 60-85 degree temperature range.

The computer program code that adjusts NMR signal intensity can be configured to adjust the NMR signal using different correction factors over at least about 12 degrees F. (about 7 degrees C.) within the defined ambient temperature range.

The computer readable program code configured to adjust the NMR signal intensity can include computer readable program code that defines a slope of temperature sensitivity associated with the model.

The computer program product may include computer readable program code configured to communicate with a remote control system that is offsite from the NMR analyzer to allow the remote control system to monitor and/or evaluate the NMR analyzer for temperature sensitivity.

The model can be a substantially linear model.

The model can be a non-linear model.

The defined temperature range can be between about 60-85 degrees F. and the measurements are of at least one metabolite in urine biosamples.

As will be appreciated by those of skill in the art in light of the present disclosure, embodiments of the present invention may include methods, systems, apparatus, circuits, processors and/or computer program products or combinations thereof.

Further features, advantages and details of the present invention will be appreciated by those of ordinary skill in the art from a reading of the figures and the detailed description of the preferred embodiments that follow, such description being merely illustrative of the present invention. Features described with respect with one embodiment can be incorporated with other embodiments although not specifically discussed therewith. That is, it is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. The foregoing and other aspects of the present invention are explained in detail in the specification set forth below.

BRIEF DESCRIPTION OF THE FIGURES

FIG. 12A is a table of LDL-P (nmol/L) vs. Temperature at low humidity according to embodiments of the present invention.

FIG. 12B is a table of LDL-P (nmol/L) vs. Temperature at high humidity according to embodiments of the present invention.

FIG. 13A is a table of HDL-P (nmol/L) vs. Temperature at low humidity according to embodiments of the present invention.

FIG. 13B is a table of HDL-P (μmol/L) vs. Temperature at high humidity according to embodiments of the present invention.

FIG. 18A is a table of LDL-P (nmol/L) % bias versus temperature at low humidity according to embodiments of the present invention.

FIG. 18B is a table of LDL-P (nmol/L) % bias versus temperature at high humidity according to embodiments of the present invention.

FIG. 19A is a table of HDL-P (μmol/L) % bias versus temperature at low humidity according to embodiments of the present invention.

FIG. 19B is a table of HDL-P (μmol/L) % bias versus temperature at high humidity according to embodiments of the present invention.

DETAILED DESCRIPTION OF EMBODIMENTS OF THE INVENTION

Figure 1:
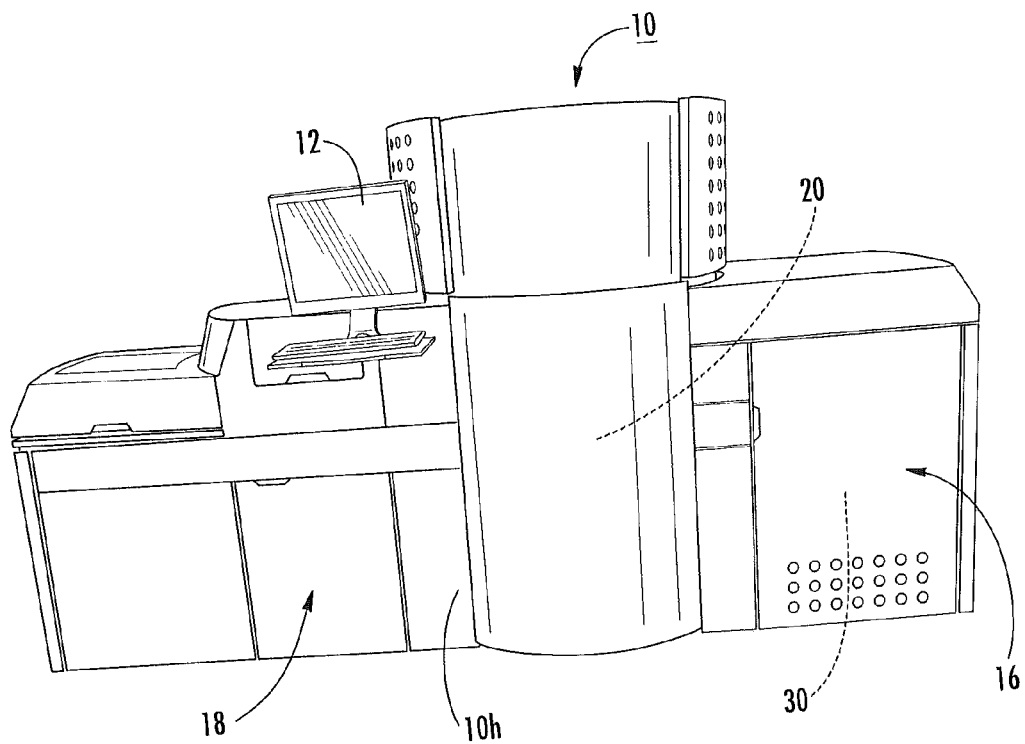
FIG. 1 is a front view of an exemplary NMR analyzer with an NMR console and a temperature sensitivity correction circuit and/or module according to embodiments of the present invention.

The present invention will now be described more fully hereinafter, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout, and thickness, size and dimensions of some components, lines, or features may be exaggerated for clarity. The order of operations and/or steps illustrated in the figures or recited in the claims are not intended to be limited to the order presented unless stated otherwise. Broken lines in the figures, where used, indicate that the feature, operation or step so indicated is optional unless specifically stated otherwise.

It will be understood that when a feature, such as a layer, region or substrate, is referred to as being "on" another feature or element, it can be directly on the other feature or element or intervening features and/or elements may also be present. In contrast, when an element is referred to as being "directly on" another feature or element, there are no intervening elements present. It will also be understood that, when a feature or element is referred to as being "connected", "attached" or "coupled" to another feature or element, it can be directly connected, attached or coupled to the other element or intervening elements may be present. In contrast, when a feature or element is referred to as being "directly connected", "directly attached" or "directly coupled" to another element, there are no intervening elements present. Although described or shown with respect to one embodiment, the features so described or shown can apply to other embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this application and should not be interpreted in an idealized or overly formal sense unless expressly so defined herein. As used herein, the term "and/or" includes any and all combinations of one or more of the associated listed items.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The term "about" means that the specified parameter need not be exactly that amount and can vary slightly, typically by +/−10%. For example, "about 2%" means that the number can be within 2.2% on one end and within 1.8% on the other.

Embodiments of the present invention may be used to analyze any in vitro biosample. The biosample may be in liquid, solid, and/or semi-solid form. The biosample may include tissue, blood, biofluids, biosolids and the like as well as combinations thereof. Thus, the term "biosample" includes, by way of example and without limitation, whole blood, plasma or serum, urine, cerebral spinal fluid (CSF), lymph samples, saliva, sputum, stool samples, lavages, semen, tissues, and/or body fluids and chemical constituents thereof in raw form and/or in preparations. The automated clinical NMR analyzer may be particularly suitable to analyze metabolites and/or lipoprotein data in in vitro blood serum and/or plasma samples or urine samples. The term "circuit" refers to an entirely software embodiment, or an embodiment combining software and hardware aspects, components or features.

The biosamples can be from any target subject. Subjects', according to the present invention, can be any animal subject, and are typically mammalian subjects (e.g., humans, canines, felines, bovines, caprines, ovines, equines, rodents (mice, rats, hamsters, guinea pigs or others), porcines, primates, monkeys, and/or lagomorphs). The animals can be laboratory animals or non-laboratory animals, whether naturally occurring, genetically engineered or modified, and/or whether being laboratory altered, lifestyle and/or diet altered or drug treated animal variations.

The term "laboratory environment" refers to laboratory environments, typically commercial or clinical (e.g., hospital) environments that do not require or cannot reliably maintain tight controlled ambient temperature ranges. The laboratory environments can be relatively large spaces that enclose several types of test systems for commercial and/or research purposes and are not typically dedicated to housing only one or more NMR analyzers.

The term "installation" refers to set-up at a field (lab) use site. The set-up can be carried out initially and at other desired intervals. Thus, the use of the phrase "at installation" is not limited to a first set-up at field placement.

The term "automatic" means that substantially all or all of the operations so described can be carried out without requiring active manual input of a human operator, and typically means that the operation(s) can be programmatically directed and/or carried out. The term "electronic" means that the system, operation or device can communicate using any suitable electronic media and typically employs programmatically controlling the communication between a control system that may be remote and one or more local NMR analyzers using a computer network.

The term "protocol" refers to an automated electronic algorithm (typically a computer program) with mathematical computations, defined rules for data interrogation and analysis that manipulates NMR data to compensate for temperature sensitivity.

The term "circuit" refers to an entirely software embodiment or an embodiment combining software and hardware aspects, features and/or components (including, for example, a processor and software associated therewith embedded therein and/or executable by, for programmatically directing and/or performing certain described actions or method steps).

The term "programmatically" means that the operation or step can be directed and/or carried out by a digital signal processor and/or computer program code. Similarly, the term "electronically" means that the step or operation can be carried out in an automated manner using electronic components rather than manually or using mental steps.

The NMR analyzers can communicate with a local but remote computer (the computer is in a different room from the spectrometers) or a remote computer in a remote location to allow the remote computer to obtain NMR spectra and analyze the NMR spectra to generate the patient diagnostic reports with quantitative values.

The term "computer network" includes one or more local area networks (LAN), wide area networks (WAN) and may, in certain embodiments, include a private intranet and/or the public Internet (also known as the World Wide Web or "the web"). The term "networked" system means that one or a plurality of local analyzers can communicate with at least one remote (local and/or offsite) control system. The remote control system may be held in a local "clean" room that is separate from the NMR clinical analyzer and not subject to the same biohazard control requirements/concerns as the NMR clinical analyzer.

As is well known to those of skill in the art, the word "integral" with reference to an NMR spectrometer refers to an obtained NMR signal (spectrum) of a sample. The integral can refer to the area of a specific peak in the NMR spectrum. The area of the peak is proportional to the concentration of that particular species. Therefore, if a (constant) concentration standard is measured, the integral value will be constant if the NMR spectrometer/instrument is performing correctly, e.g., the value is within a target range, such as +/−10%, and in some embodiments, +/− about 2%. Alternatively, the integral can be based on more than one peak, or even of all the peaks of the NMR spectrum, but it is more common to measure the area of one defined peak.

When measuring a known concentration standard as a stand-alone "calibration" sample, the integral provides a good test for (day-to-day) performance that allows quantitative NMR without adding an internal standard to a respective biosample. The term "concentration standard" refers to a liquid that is used to evaluate one or more peaks in an NMR spectrum. Examples of concentration standards include ethyl benzene solutions for organic systems (non-polar) and sodium acetate solutions for aqueous systems. In particular embodiments, a TMA (trimethyl acetic acid) solution may be used as a concentration standard. The TMA solution can have a specific ionic strength so that it behaves as plasma/serum or other sample of interest would with respect to NMR behavior.

To evaluate whether an NMR analyzer or related circuits or processor(s) with the temperature compensation protocols can achieve a +/−2% accuracy over the large temperature range(s), a TMA test solution (typically "fresh" and in a volume of about 30 ml) at a defined temperature can be used. Typically, 10-20 NMR test replicates of a test sample are generated and the mean value of the quantitative measurements can be used. The TMA measurements can be carried out with a standard containing 15 mM TMA. A 15 mM solution or other suitable concentration providing sufficient signal-to-noise for quantification. The temperature of the of the TMA during NMR signal acquisition can be 47 deg C., but should be equally applicable to wider range like 15-60 degrees C., with NMR probe temperature regulated to within 0.5 degrees (or better) of the target temperature.

For clinical measurements of actual samples, embodiments of the invention can generate quantitative measurements that are within +/−10% over the large temperature range. The +/−10% variation can be measured at an operating temperature in the temperature range as compared to a measurement that is obtained when a corresponding control analyte (e.g., a control sample such as fresh or frozen human serum or plasma samples with known lipid values from Soloman Park Research Laboratories, Kirkland, Wash., or the like, having the same buffers and other conditions) is measured on the same NMR analyzer at a standard ambient temperature of about 77 degrees F. (25 degrees C.). Again, a number of tests (e.g., typically between 10-20) can be carried out at a respective temperature and a mean value can be used for the comparison. Thus, the +/−10% variation includes assay variation, NMR variation and the temperature compensation protocol, and can be evaluated based on a % deviation (which can be called a % bias) from a measurement of the control at the standard temperature. The measurements can be for lipoprotein analytes such as HDL-P, LDL-P and triglycerides. NMR measurements of lipoprotein subclasses used to determine HDL-P, LDL-P and triglycerides are known as described, for example, in U.S. Patent/Application Nos. US2005/0222504, U.S. Pat. No. 6,518,069 and US2010/0100334, which were incorporated by reference hereinabove. Similar results (+/−10% or better) can be expected for other NMR quantifiable analytes including TMANO.

The term "model" refers to a mathematical representation that defines or accurately estimates temperature sensitivity of an NMR analyzer over an ambient temperature range. The model can be based on linear and/or non-linear signal intensity data over the defined temperature range. For a respective NMR analyzer, more than one model can be used and an appropriate one of the models can be automatically (programmatically) selected based on a contemporaneous operating temperature (e.g., either or both an external or internal or "on-board" temperature) associated with a test sample.

It is contemplated that the clinical NMR analyzers are particularly suitable to obtain data measurements of biosamples including qualitative and/or quantitative measurements that can be used for therapeutic or diagnostic purposes, and typically for diagnostic purposes that meet the appropriate regulatory guidelines for accuracy, depending on the jurisdiction and/or test being performed. It is also contemplated that the auto-temperature compensation protocol will benefit the measurement of NMR quantifiable metabolites in human biofluids of the type serum/plasma, urine, CSF, semen, sputum, lavages and the like.

In some embodiments, the automated NMR analyzers can be configured to meet governmental medical regulatory requirements such as those described in applicable federal regulations, including those in 21 CFR (such as 21 CFR 820 and 21 CFR 11) for medical devices. The NMR clinical analyzers can be constructed and/or configured in such a manner as to be able to obtain PMA (pre-market approval) and/or 510 (k) approval from the United States Food and Drug Agency ("USFDA") and/or corresponding foreign agencies for performing diagnostic tests. NMR spectrometers are available from Agilent Technologies (which acquired Varian, Inc.), having a principal place of business in Santa Clara, Calif. and Bruker BioSpin, Corp., located in Billerica, Mass. The Vantera® NMR clinical analyzer with the NMR spectrometer (from Agilent) and integrated biosample handler is available from LipoScience, Inc., located in Raleigh, N.C. The term "NMR analyzers" refers to instruments that include NMR spectrometers and are also known as NMR detectors. The NMR analyzers can have integrated or discrete cooperating automated sample handlers to automate sample analysis and increase through-put.

Embodiments of the present invention can be carried out to compensate for (ambient) room temperature variation without requiring the use of an internal standard, e.g., a standard in a respective biosample undergoing testing. While the use of an internal standard method has an advantage that even if the spectrometer performance changes, the change relative to the internal standard will be constant, the use of an internal standard typically requires a standard of known purity and concentration to be added accurately to the sample to be tested. Another issue may be the shelf life of the standard and/or if it will have any chemical or spectroscopic interferences with the sample.

FIG. 1 illustrates an NMR analyzer 10 that has a housing 10h that includes an NMR console 16 and an integrated sample handler 18, with the NMR magnet 20 inside a common housing 10h. However, the NMR analyzer 10 may be configured as separate components in different housings. The NMR analyzer 10 includes a UI (User Interface). As shown, the UI includes a touch screen user input 12 (e.g., an HMI or human machine interface) to allow an operator to communicate with the instrument. The term "NMR console" (also known as an RF console) refers to a housing or portion thereof that encloses hardware components that support the NMR spectrometer including circuitry, wiring, an RF amplifier, one or more gradient amplifiers and associated electronics for transmitting an excitation RF pulse(s) (pulse sequence) to an RF coil in the NMR probe 32 (FIG. 5) and obtaining NMR signal of a sample as is well known to those of skill in the art.

Figure 2:
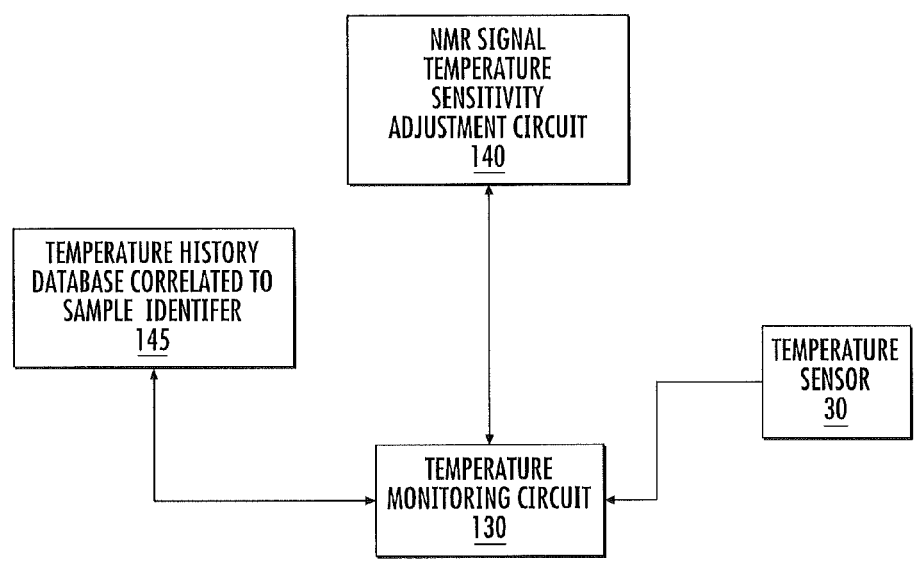
FIG. 2 is a block diagram of components/inputs to a temperature sensitivity adjustment circuit according to embodiments of the present invention.

The NMR analyzer 10 includes at least one temperature sensor 30 and also includes, or is in communication with, a temperature monitoring circuit 130 and an NMR signal temperature sensitivity adjustment circuit 140 (FIG. 2). The circuit 140 can include at least one (digital) signal processor that includes computer program code that carries out the temperature sensitivity adjustment. The processor can be on-board the analyzer or remote or one or a local and remote processor can communicate to carry out the adjustment. The at least one temperature sensor 30 can be on-board or in the room housing the NMR analyzer 10, if the latter, the temperature sensor 30 is preferably proximately located to the NMR analyzer 10. The at least one temperature sensor 30 should be positioned to reflect a temperature of the lab environment (indirectly or directly) and/or an internal chamber of the NMR console 16. In some embodiments, the NMR analyzer 10 can include both an external temperature sensor and an internal temperature sensor and the temperatures can be stored in a database, correlated to time and date and/or patient sample measurements.

In some embodiments, the at least one temperature sensor 30 can include at least one temperature sensor 30 that is on-board the NMR analyzer 10, typically inside the NMR console 16, as will be discussed further below. Referring to FIG. 2, in some embodiments, the temperature monitoring circuit 130 and the NMR signal temperature sensitivity adjustment circuit 140 are on-board the NMR signal analyzer 10. In other embodiments, one or both of the circuits 130, 140 can be remote from the analyzer itself or partially housed in the analyzer 10 and partially in a remote computer. In addition, the circuits 130, 140 can be configured as a single circuit or separated into more than two circuits.

As also shown in FIG. 2, the NMR analyzer 10 may be configured to generate an electronic temperature history database 145 that is or can be correlated to the different biosamples tested. The correlation can be at the time of the NMR signal acquisition, or later. The correlation can be automatically and/or programmatically carried out via patient identifier data, biosample identifier data, test type, and/or test time, date, and the like. The NMR analyzer 10 is configured to obtain NMR signals of biosamples undergoing testing. This integral signal of the respective biosample can then be adjusted based on at least one temperature detected proximate in time (typically during) the NMR signal acquisition of a respective biosample. In some embodiments, several temperatures can be obtained from the at least one sensor 30 during an NMR signal acquisition of a sample. The circuit 130 can optionally detect temperature substantially continuously or at selected time intervals, e.g., every minute, every second, every 5-20 seconds, such as about every 10 seconds, and the like. The detection interval may increase automatically if a temperature change in the external environment and/or on-board the analyzer changes above a certain amount or may decrease automatically if the temperature is substantially constant.

The NMR analyzers 10 can be configured to use one or more of the detected temperatures to electronically select and/or calculate a corresponding correction factor (that changes as the temperature changes) that is used to adjust a respective NMR signal of a biosample for temperature sensitivity of the NMR analyzer. The temperatures over a suitable time interval may be averaged or a median temperature used to select and/or calculate an appropriate temperature sensitivity correction factor. In other embodiments, a high temperature or a low temperature detected proximate in time (e.g., during) signal acquisition may be used for selecting and/or calculating the correction factor. Thus, the automated temperature-compensated NMR clinical analyzers 10 (FIG. 1) can be configured to obtain accurate quantified measurements in laboratory environments that do not require tight temperature controls by adjusting NMR signals of a biosample using a temperature sensitivity adjustment that varies over a temperature range in a known or predictable manner. In some embodiments, the adjustment is carried out using a slope of a defined pre-obtained signal (integral of a control standard) that varies substantially linearly and predictably based on temperature over a temperature range of at least about 10 degrees.

In some embodiments, the temperature compensation protocol can be configured to cover a temperature range of at least about 12 degrees F. (at least about 7 degrees C.). The range can be between at least about 63-75 degrees F., typically between about 60 or 61 degrees F. to about 85 degrees F., using only a data correction protocol (e.g., computational factor) and/or program/software applied post-signal acquisition without requiring any NMR hardware changes or active cooling. In some embodiments, the NMR analyzers can even operate over a large range of ambient (and onboard mixer) temperatures using only the post-signal acquisition data correction protocol or factor. For example, the NMR analyzers can operate in ambient room temperatures of about 60 degrees F., 61 degrees F., or 63 degrees F. at the low end up to about 82 degrees F., 83 degrees F., 84 degrees F. or 85 degrees F. on the high end all, while providing accurate quantitative test results. In some embodiments, the temperature compensation can allow about a 24 or 25 degree F. ambient temperature operating range (about a 14 degree C.) temperature range, from 60-85 degrees F. that can compensate sensitivity loss or gain to generate quantitative NMR data for analytes in biosamples, such as lipoproteins.

In some embodiments, the temperature from the sensor 30 is between about 12-15 degrees greater, on average, than the ambient room temperature. Thus, for example, if the sensor 30 in the mixer chamber 42 reads a temperature of 75 degrees F.; the corresponding lab ambient temperature is typically about 63 degrees F., if ambient temperature is 75 degrees F., the on-board temperature is 87 degrees F. However, the detected on-board temperature, while increased relative to ambient room temperature, may have a different temperature correlation, higher or lower than the about 12 degrees. See, e.g., FIGS. 11A and 11B which illustrate data from temperatures in a mixer area to environmental (ambient) temperatures over a range of 60-85 degrees F. The (low humidity) graph shows a variation of about 13.6 degrees at 85 degrees F. and a variation of about 15 degrees at 60 degrees F.

Figure 3A:
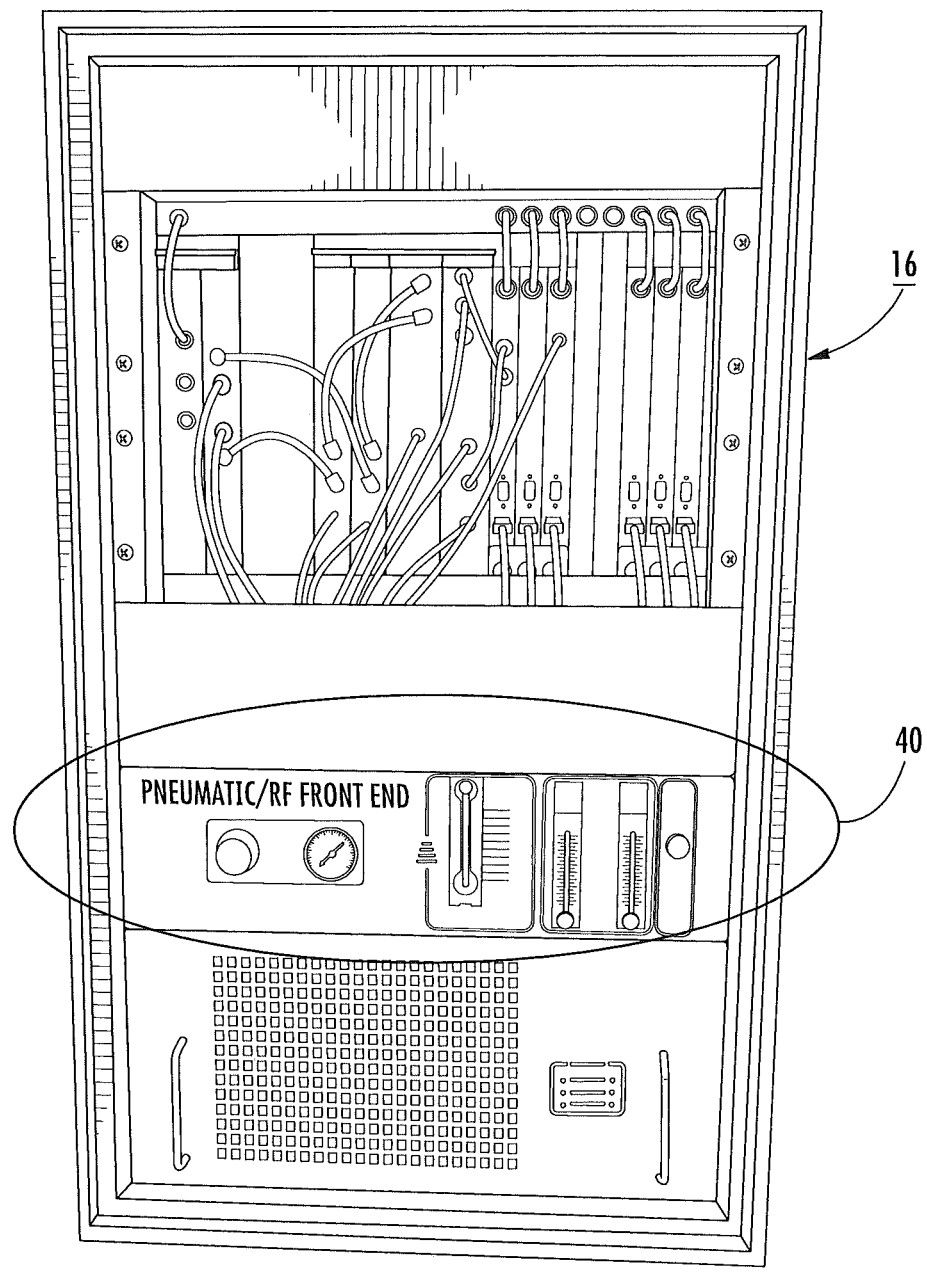
FIG. 3A is a front view of the NMR console shown in FIG. 1.
Figure 3B:
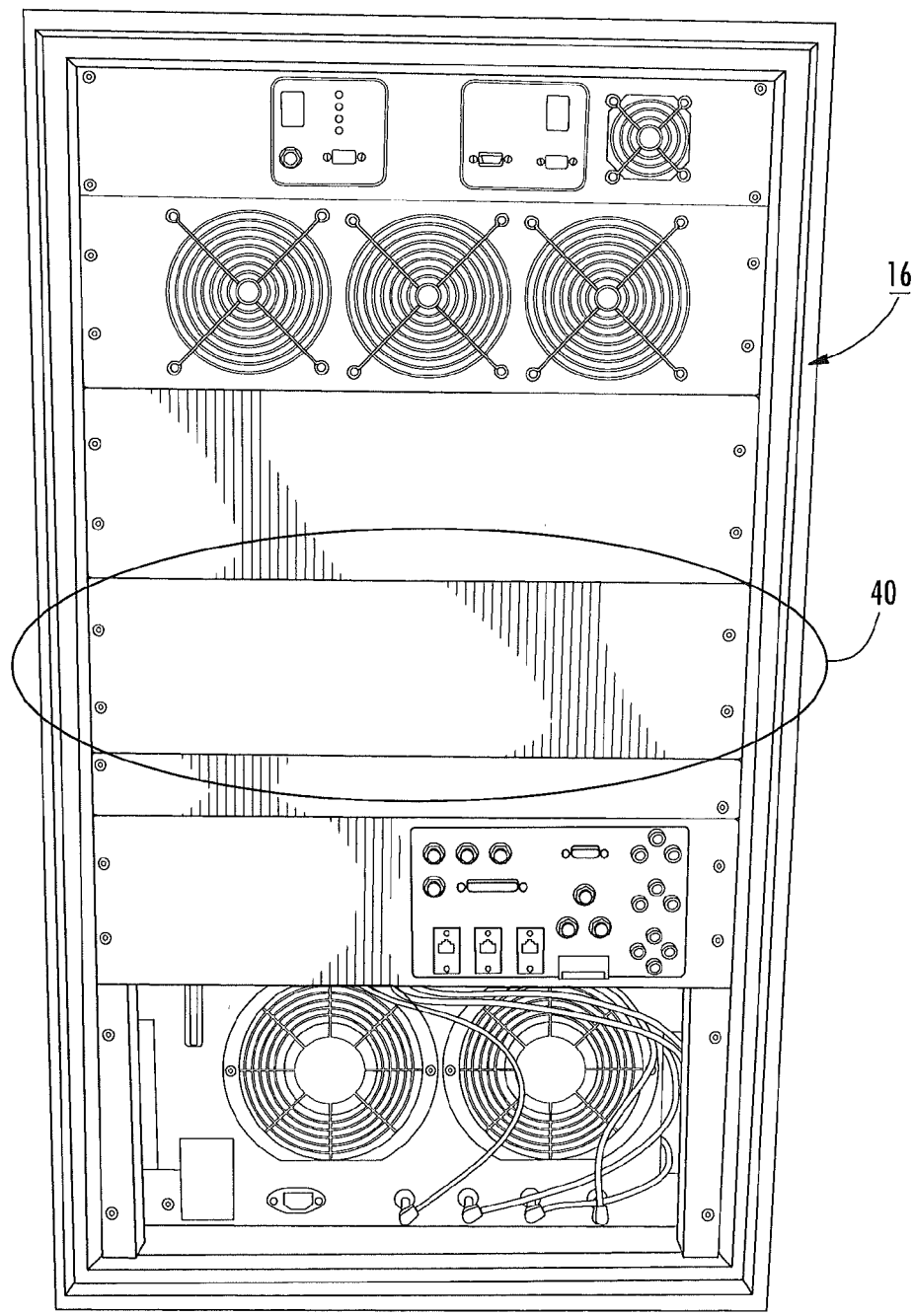
FIG. 3B is a rear view of the NMR console shown in FIGS. 1 and 3A.
Figure 4A:
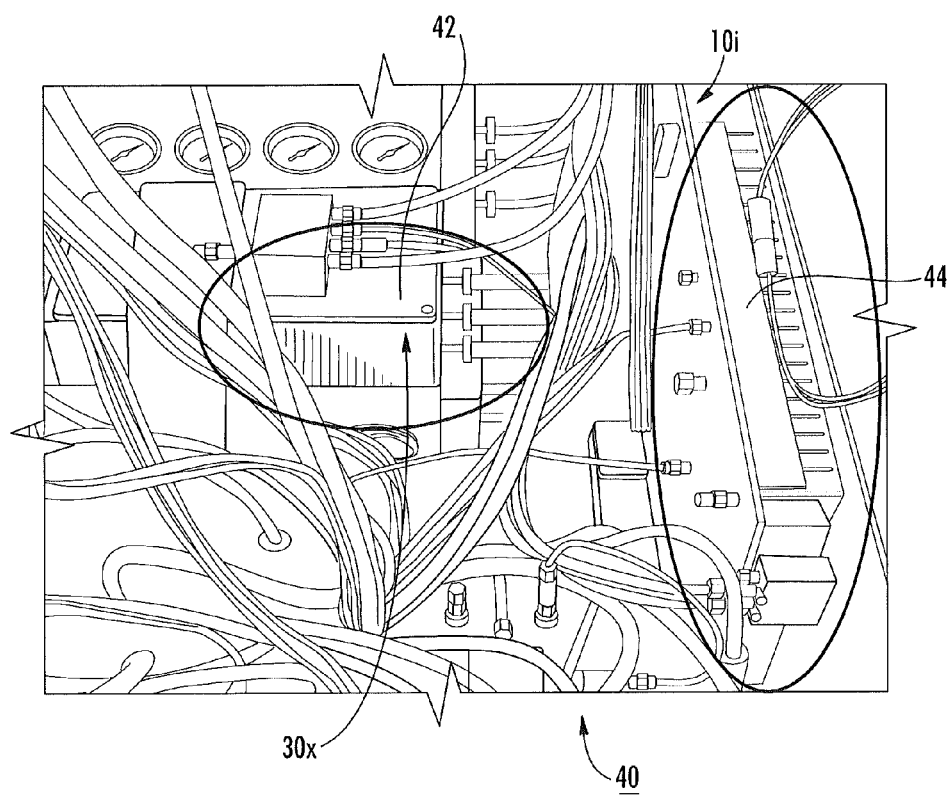
FIG. 4A is a rear top perspective view of a portion of a drawer shown in FIGS. 3A and 3B.
Figure 4B:
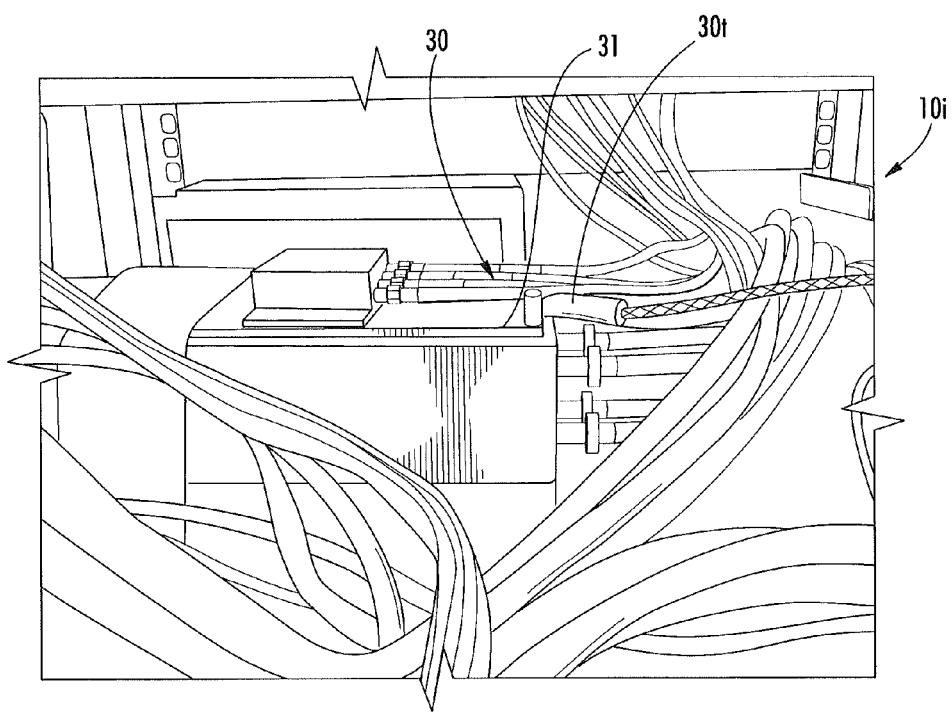
FIG. 4B is a rear view of the portion of the drawer shown in FIG. 4A illustrating an on-board temperature sensor proximate a mixer box according to some optional embodiments of the present invention.

FIG. 3A illustrates a front view of the NMR console 16 (inside the external housing) and FIG. 3B illustrates a rear view of the NMR console 16 with a Pneumatic Front End (PFE) compartment 40. This compartment 40 is typically a drawer that can slide in and out for access to internal electronics. This compartment also typically contains some valves for air handling and RF electronics. In some embodiments, at least one temperature sensor 30 is placed in this compartment 40. FIGS. 4A and 4B illustrate a mixer box 42 and preamplifier 44 are held in this compartment 40. FIG. 4B also illustrates a suitable location 30x for a temperature sensor 30 (FIG. 4C) contemplated by embodiments of the invention. The temperature sensor 30 can be a thermocouple 30t mounted to the mixer box 42 and held on a thermal insulator or thermal barrier substrate 31 (to prevent thermal contact with the metallic mixer box 42) for temperature insulation. After extensive evaluation, this location has been found to be particularly representative (e.g., a good predictor) of NMR instrument temperature sensitivity for temperature sensitivity adjustment (at least for the Agilent 400MR NMR console). The temperature sensor 30 (such as a thermocouple) can be positioned in that drawer 40 so that it can be monitored by on-board or remote software. In some embodiments, this monitored internal temperature can be displayed on the GUI 12 (FIG. 1). However, it is contemplated that other locations may also be suitable. In addition, NMR spectrometers from other manufacturers or other configurations with different hardware components may have other suitable temperature monitoring locations. Further, more than one temperature can be monitored at different locations and the high, low, average or median value, or other corresponding measure of temperature, of those temperatures can be used for temperature sensitivity compensation.

Other temperature sensors and/or locations may be used. For example, a temperature sensor 30 may be incorporated into a printed circuit board, placed inside the mixer box 42, placed at other or additional locations inside the compartment 40 or at other locations on or in the NMR analyzer 10, typically on or in the NMR console 16.

Figure 5:
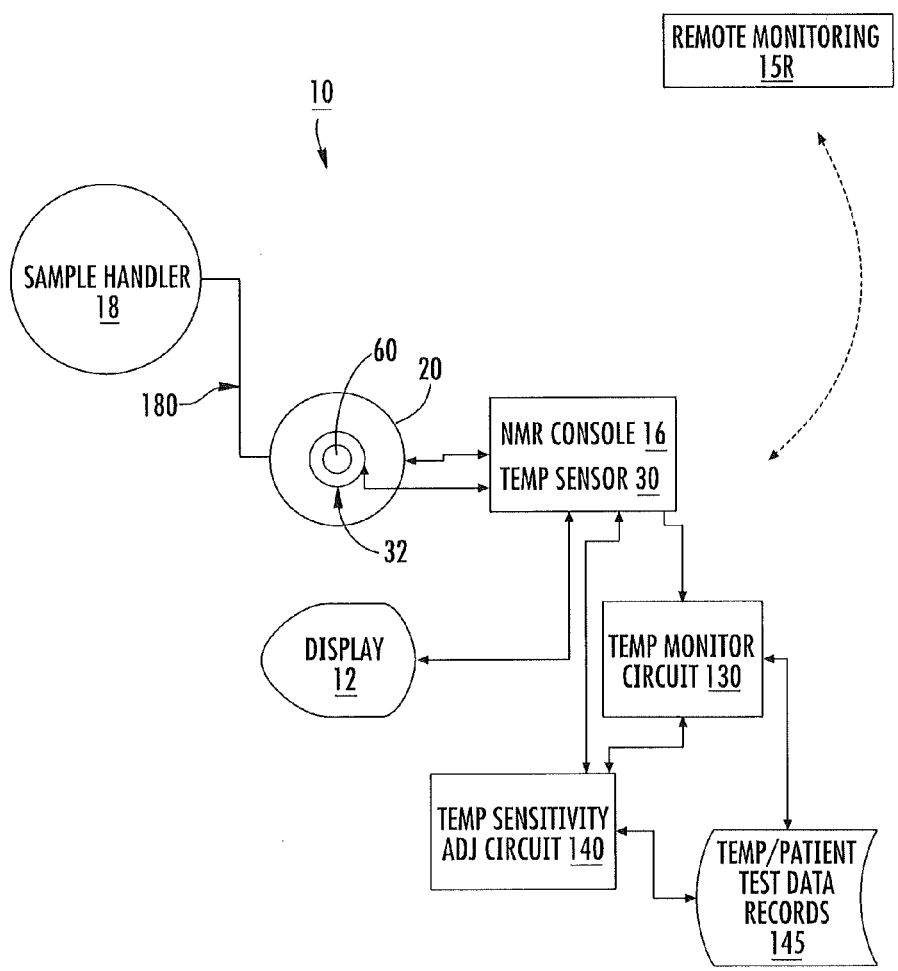
FIG. 5 is a schematic illustration of an NMR analyzer according to embodiments of the present invention.

FIG. 5 is a schematic illustration of an NMR analyzer 10. As is well known to those of skill in the art, NMR analyzers (also known as NMR detectors or NMR spectrometers) include an RF amplifier, an NMR probe 32 that includes an RF excitation coil (such as a saddle or Helmholtz coil), and a cryogenically cooled high-field superconducting magnet 20. The analyzers 10 may also include an enclosed flow path 180 that directs samples to flow serially to the flow cell 60.

The NMR probe 32 can be a top-loaded probe inserted from a top of the magnet bore to a predetermined analysis location in the magnet bore. The high-field magnet 20 is held in a magnetically and/or RF shielded housing that can reduce the magnetic field level that is generated to within a relatively small volume. The flow cell 60 is a passive device. The probe 32 broadcasts the RF that is put into it and returns a small NMR signal for processing. The term "high-field" magnet refers to magnets that are greater than 1 Tesla, typically greater than 5 Tesla, and more typically about 9 Tesla or greater. The NMR (flow) probe 32 is in communication with the RF amplifier/pulse generator and includes an RF excite/receive circuit held in the bore during operation.

Still referring to FIG. 5, the NMR analyzer 10 can optionally be configured to communicate with a remote site 15R via a computer network (hardwired or wirelessly) typically via the Internet. The remote site can be in a control room onsite in the laboratory facility or building, and/or at a remote site away from the lab building itself that monitors a plurality of different NMR analyzers at different facilities. The control site 15R can be configured to monitor temperature sensitivity of different analyzers using concentration standard integrals and detected temperatures of a respective NMR analyzer 10. The NMR analyzers 10 can be configured to accept updated temperature sensitivity control algorithms from the remote control site 15R or a service person can update the temperature adjustment circuit per instructions from the remote site 15R (typically based on instrument specific operational information collected or analyzed by the remote site 15R, such as data from a calibration assay, such as a concentration standard integral at different temperatures over time).

The NMR analyzer 10 can be configured to serially flow biosamples using a flow cell 60 as noted. However, other sample handlers and biosample introduction means can be used. For example, the biosample can be processed as it is held in a respective tube or other sample container (not shown).

Although shown as separate circuits 130, 140 and a separate data record database 145, these circuits and database or portions thereof may be combined or otherwise provided. These circuits and database 130, 140, 145 may be integrated into one or more processors in the NMR analyzer 10 or provided in one or more remote processors. The temperature monitoring circuit 130 can be configured to identify when a temperature is under or over defined thresholds and send an error message and/or alert to an operator. The alert or message can be provided on the display 12 and/or to a wireless device, such as a portable communications device, and the remote monitoring site 15R.

The circuits 130, 140 and database 145 an be integrated onboard the NMR analyzers 10 or at least partially (if not totally) remote from the respective NMR analyzer 10. If the latter, one or more of the modules or circuits 130, 140 or database 145 can reside totally or partially on a (remote) server. The server can be provided using cloud computing which includes the provision of computational resources on demand via a computer network. The resources can be embodied as various infrastructure services (e.g. computer, storage, etc.) as well as applications, databases, file services, email, etc. In the traditional model of computing, both data and software are typically fully contained on the user's computer; in cloud computing, the user's computer may contain little software or data (perhaps an operating system and/or web browser), and may serve as little more than a display terminal for processes occurring on a network of external computers. A cloud computing service (or an aggregation of multiple cloud resources) may be generally referred to as the "Cloud". Cloud storage may include a model of networked computer data storage where data is stored on multiple virtual servers, rather than being hosted on one or more dedicated servers. Data transfer can be encrypted and can be done via the Internet using any appropriate firewalls to comply with industry or regulatory standards such as HIPAA, at least where patient samples are being analyzed. The term "HIPAA" refers to the United States laws defined by the Health Insurance Portability and Accountability Act. The patient data can include an accession number or identifier, gender, age and test data.

The adjustment circuit 140 can be configured to selectively adjust the signal so that it is carried out only when a detected temperature deviates beyond about 1 degree C. from a preset (defined or baseline) temperature of the NMR analyzer, typically taken at installation. In other embodiments, the adjustment is made to all sample data even if the temperature is substantially constant. However, if the temperature-sensitivity adjustment is not carried out, the NMR analyzer can still apply a non-temperature sensitive instrument normalization factor to thereby normalize measurements taken over a plurality of different NMR analyzers.

Figure 6:
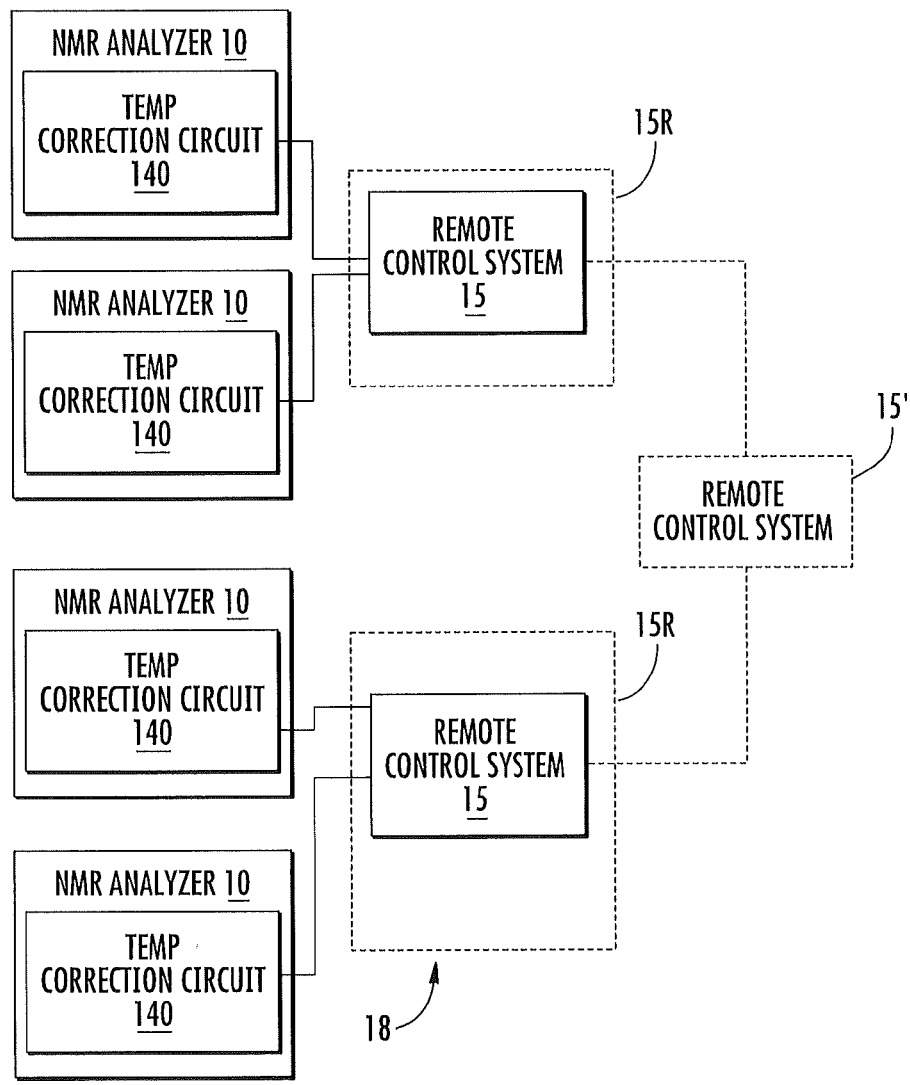
FIG. 6 is a schematic illustration of a networked system of a plurality of local clinical NMR analyzers that are in communication with an automated remote service/support system according to embodiments of the present invention.

FIG. 6 illustrates a network of analyzers 10 with temperature sensitivity correction modules or circuits 140 at different sites that are in communication with at least one remote site 15R, 15' that allows for the download of data from each analyzer 10 and/or remove monitoring. In some embodiments, a remote site 15R (FIG. 5) can download data periodically, including, for example, dynamically as it is acquired. Raw TMA (or other standard) integral versus console mixer temperature can be plotted. Electronic monitoring of this data may improve the defined slope used for signal correction for quantitative measurements and/or monitor for changes in output.

The NMR analyzers 10 can operate in environments that fluctuate in ambient temperature about +/−5 degrees (or even more), typically between at least about 63 degrees Fahrenheit (F) (about 17 degrees Celsius ("C")) to about 73 degrees F. (about 23 degrees C.), allowing for temperature fluctuation in the lab or NMR console room of at least +/−5 degrees, and more typically allowing for ambient temperatures within the above noted entire range of at least 10 degrees F. (6 degrees C.), while still generating quantitative measurements with an accuracy of between about +/−2%. The accuracy of a measurement at different temperatures within this range can be evaluated using a concentration standard assay integral with an NMR analyzer having the automated temperature sensitivity compensation protocol. The NMR analyzer should pass the auto-calibration protocol and/or provide accurate values for the concentration standard integral, typically at about +/−2% or better, to operate (anywhere) in the large operational target range, e.g., 60-85, 61-85, or 63-75 degrees F. (e.g., between about 17-24 degrees C. or between about 15.6-29.4 degrees C.).

In some embodiments, the NMR analyzers 10 can be configured with the temperature sensitivity adjustment protocol of the obtained signal to allow for an even greater ambient temperature operating range, e.g., typically between about 61 degrees F. (about 17 degrees C.) to at least about 80 degrees F. (27 degrees C.) with temperatures that can fluctuate at least about +/−10 degrees F. (8 degrees C.) from a defined nominal with the range (e.g., 70 degrees F.) so that the NMR analyzer can still generate quantitative measurements with sufficient accuracy, e.g., +/−10%, typically with +/−2% accuracy. In some embodiments, the operational range can be between about 60 degrees F. to about 85 degrees F. In some embodiments, the allowable temperature operating range is at least 63 degrees F. to at least 82 degrees F., such as 83 F., 84 degrees F., 85 degrees F. while still providing the desired accuracy. The accuracy can be at least +/−10% for clinical samples and typically about +/−2% accuracy for TMA control samples.

The temperature sensed by sensor 30 can be above the ambient temperature. In some particular embodiments, for a temperature sensor 30 mounted to the mixer box 42, the temperature monitored on the analyzer can be, for example, between about 10-16 degrees above the ambient room temperature, typically about 12-15 degrees above as described above, but larger or smaller temperature differences may exist.

The temperatures used for developing the linear or non-linear model for the adjustment can be based on on-board (e.g., mixer) temperatures over a temperature range in a lab. The system performance can be defined based on the ambient room temperature (e.g., lab temperature).

As noted above, it has been unexpectedly determined that when monitoring temperature using a temperature sensor 30 (e.g., one that is mounted on-board the NMR analyzer, such as, in the drawer 40), the NMR sensitivity and phase changes are approximately a linear function of the temperature when the data is statistically fitted to a defined mathematical function. In other embodiments, the data may be somewhat non-linear, but evaluated using a least squares best fit first or multi (e.g., second or higher) order polynomial equation. It is contemplated that other statistical equations/functions may also be used to generate the relationship. Although certain embodiments describe the use of slope to carry out the automated signal adjustments for temperature, a look-up table or an in situ determined calculation may also be used. Alternatively, the correction type or model can be calculated in situ using a defined function and input parameters to calculate the adjustment.

Figure 7:
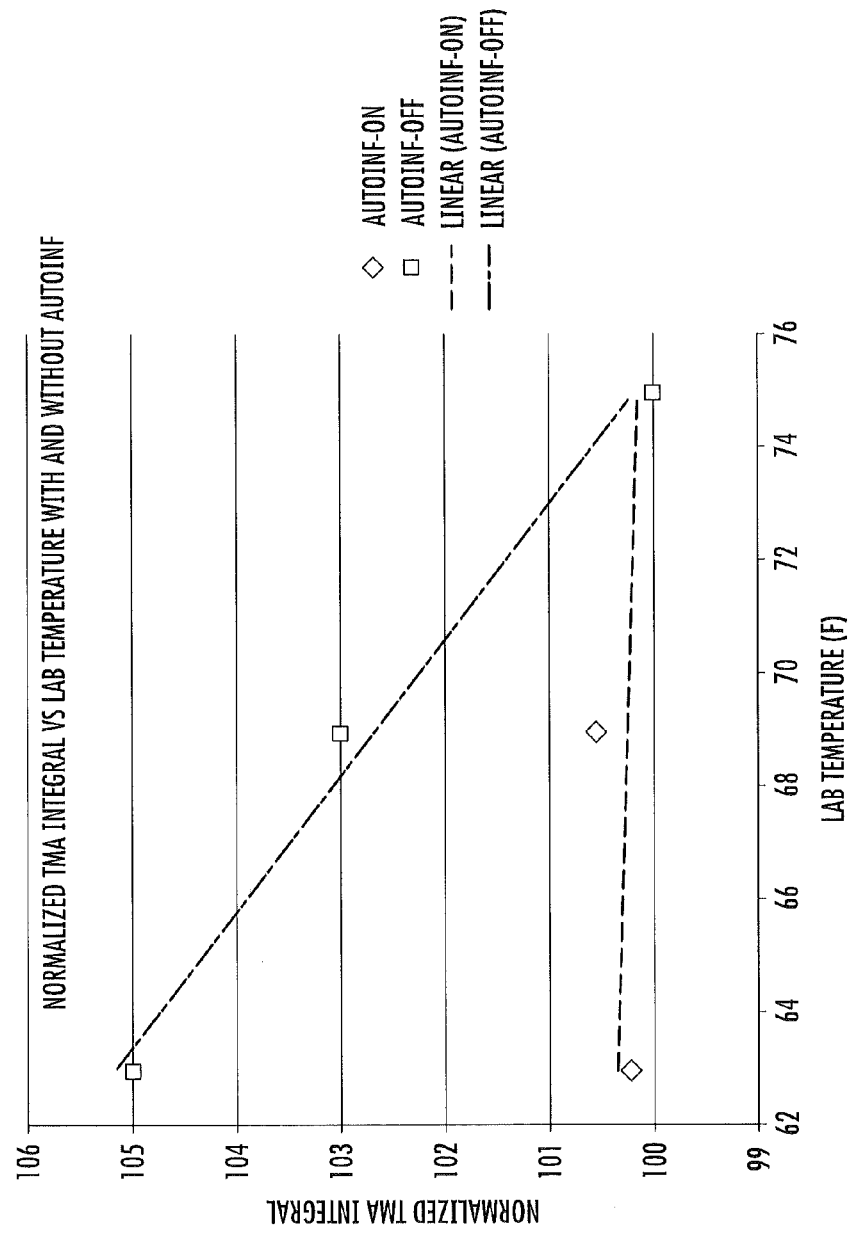
FIG. 7 is a graph of a normalized integral versus lab temperature with and without temperature sensitivity correction according to embodiments of the present invention.
Figure 10:
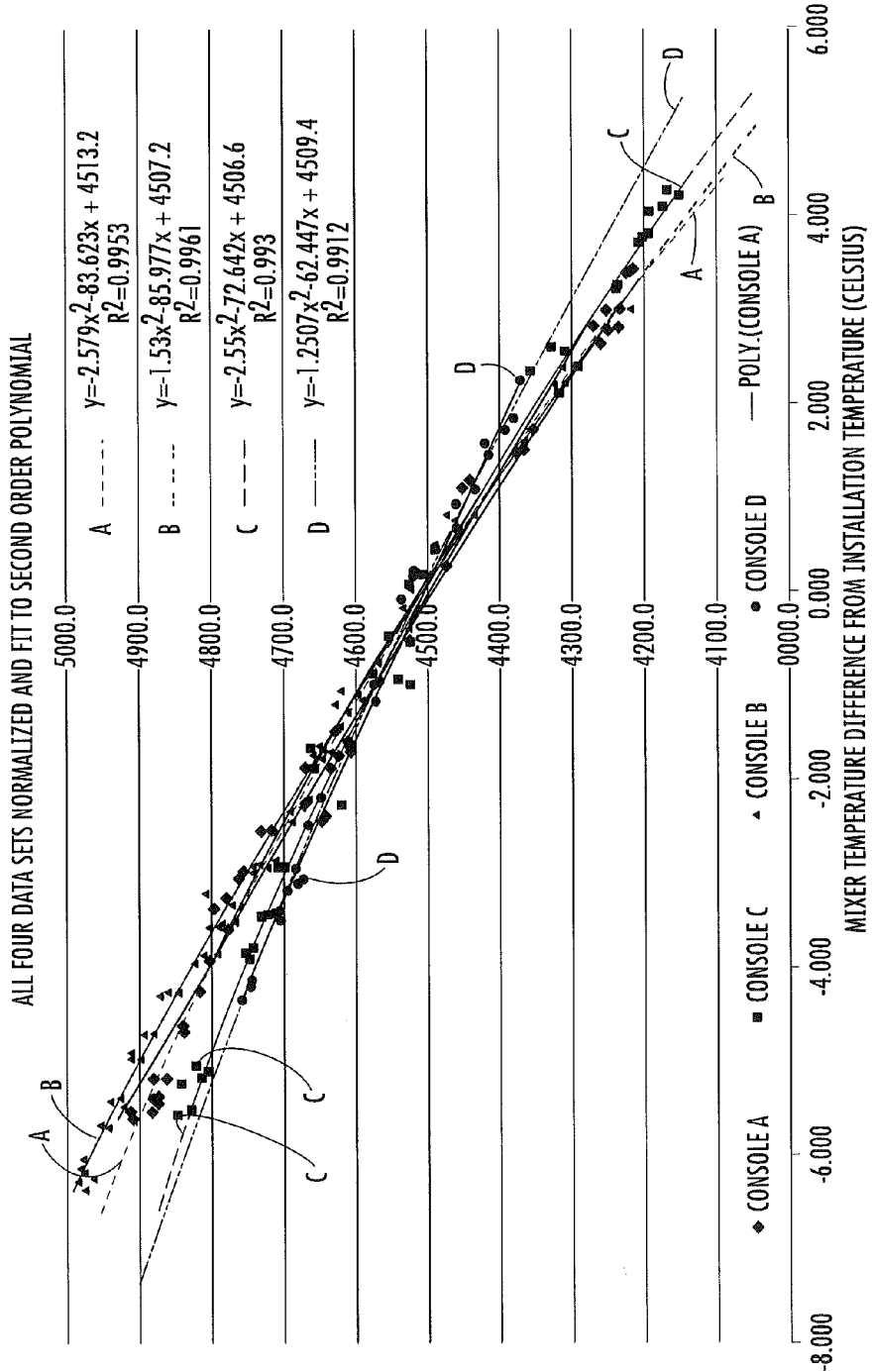
FIG. 10 is a graph of TMA integral from TMA Assay (normalized and fit to second order polynomial) versus mixture temperature difference from installation temperature of four NMR consoles according to embodiments of the present invention.

The monitored temperature is associated with ambient temperature in that it varies based on a change in ambient temperature and can be directly or indirectly correlated to ambient temperature. Further, although described as using a linear relationship of signal versus temperature, it is also contemplated that non-linear relationships may be used. FIG. 7 shows a situation where a linear model was used to correct to obtain sensitivity fidelity. FIG. 10 shows an example of a non-linear fit to the temperature/signal data using second order polynomials with equations similar to $y=ax^2+bx+c$. In many embodiments, where within about 2% of accuracy is sufficient, a linear model is contemplated to be suitable. In other embodiments, such as for applications that may require or desire a higher accuracy, a non-linear model may provide a better protocol. The non-linear protocol may also be more appropriate where the NMR analyzer may operate at the low and/or high extremes of the ambient operational temperature range.

In particular embodiments, the NMR analyzer 10 can be configured to include both linear and non-linear models of temperature sensitivity. The NMR analyzer 10 can select which model to use based on the detected operational range and/or the analysis of a particular sample or groups of samples at a particular lab. It is also contemplated that the NMR analyzer 10 may use both types of models as a validation assessment to compare calculated adjustments of the obtained signal. This "double check" can be carried out periodically or for each sample.

In some embodiments, the NMR sensitivity vs. temperature performance of a respective NMR analyzer can be defined for that specific analyzer (or NMR console 16) and the output of the analyzer 10 can be adjusted by multiplying the obtained signal by a normalization factor that changes as a function of the system temperature.

In particular embodiments, each NMR console 16 and probe 32 combination will produce a unique (instrument specific) value for the integral of a concentration standard solution run under standard conditions. To normalize the different analyzers 10, a factor called the Instrument Normalization Factor ("INF") can be identified and multiplied by the integral of the concentration standard to produce an integral value that is substantially identical with other NMR analyzers of like kind (such as those already operating in a production laboratory). In the past, the Vantera® NMR analyzer used an instrument sensitivity factor that was measured at installation and the instrument-specific INF was then saved in the system software and signal amplitude for samples were multiplied by this value. The normalization factor can be used to standardize the measurements of different NMR analyzers.

Different NMR probes will have different (typically instrument specific) sensitivities based on the "Q" factor of the probe. Q is defined as the frequency of the resonant circuit divided by the half power bandwidth. A standard sample like, for example, trimethyl acetic acid (TMA) can be run on each NMR console and (and with different RF probes), and the integral of the $CH_3$ protons can be measured to standardize it to a fixed value. The ratio between the predefined (fixed) value and the integral under then-current conditions is termed the "normalization factor", and this can be used to standardize different NMR analyzers by multiplying any raw NMR intensity by the normalization factor. Hence, the NMR normalization factor can be calculated in situ for each NMR analyzer and respective RF probe and, in some embodiments, adjusted for each NMR analyzer at desired intervals (such as after certain numbers of samples, upon start-up, upon detection of a change in selected local operational conditions).

As an improvement, to allow for operation in the ambient temperature fluctuation of lab environments, the INF value can be stored in the NMR system 10 (e.g., circuit and/or software) along with a temperature determined as a baseline for temperature sensitivity for that instrument.

In addition, a defined mathematical relationship of sensitivity vs. temperature slope as a model of temperature sensitivity can be used to change the values of the obtained NMR signals to correct for the sensitivity difference between the temperature at which the sample was run and the temperature at which the "baseline sensitivity" of the instrument was determined.

In other embodiments, rather than determining the temperature/sensitivity baseline at installation, this temperature sensitivity data may also be determined at an OEM site or a pre-installation site, or potentially using only a portion of the NMR analyzer in a simulated system. In any event, the temperature sensitivity adjustment can be electronically (typically automatically) executed for every sample, if appropriate, and the operator does not have to correct the result based on the room temperature. Examples of INF including temperature sensitivity corrections are described below (in the Equations below, identified as AUTO (or auto) INF), are also discussed below. The temperature sensitivity correction circuit 140 (FIGS. 2, 5) can be selectively turned on or off using the HMI or UI of the display, for example, or via a local command or a remote command from a control site.

Embodiments of the invention can automatically electronically (programmatically) adjust collected NMR signal data based on a known model or relationship of temperature sensitivity thus applying a post-signal collection correction adjustment factor (multiplier) without requiring any additional change to NMR hardware.

In particular embodiments, the known model or relationship can be a substantially linear model or relationship. The substantially linear model can be generated using data obtained when one or more NMR spectrometers are held inside a thermally controlled chamber (however, other ways of obtaining this data is contemplated as will be discussed below). Once the linear relationship is determined or known, a respective NMR spectrometer can be programmatically configured to determine concentration of an analyte that is corrected for temperature based on a known temperature sensitivity model using an internal or external temperature that is directly or indirectly correlated to ambient temperature at a time of measurement.

The temperature sensitivity model which may be a substantially linear relationship/model can be provided as data associated with a line with a slope that defines the correction factors for different temperatures.

The data to generate the appropriate temperature sensitivity model for a respective NMR analyzer or versions thereof can be established per NMR spectrometer at an OEM site or assembly site or at a use site. Alternatively, rather than a custom or per-unit defined temperature sensitivity model/relationship, a sample of NMR spectrometers can be evaluated and a "standard" model/relationship can be established for similar NMR spectrometers, based on an average, median or other parameter of temperature sensitivity. The temperature sensitivity data for NMR spectrometers (new or in the field) may be updated or recalculated as new models, new versions or replacement components of on-board devices or components are implemented or used.

The temperature sensitivity data may also be established using a sub-assembly that is placed into a dedicated "test" NMR spectrometer console or a "phantom" or "simulated" NMR console as, for example, components of a mixer drawer sub-assembly and associated spatial volume may sufficiently represent conditions allowing temperature sensitivity for a corresponding NMR console and/or analyzer to be determined prior to full assembly.

An example of a mathematical equation that can be used to calculate a temperature sensitivity adjustment factor (autoINF) is shown in Equation 1 below where slope is the slope of concentration standard signal (of a, "control or calibration" material) versus temperature over a temperature range and "consoleTemp" refers to a current or temporally relevant temperature of a location on-board the NMR console 16. In some embodiments, the automated correction can be carried out using an "autoINF" calculation that can have two or more parts. One part is the instrument normalization factor (INF) and another can be the temperature-dependent part (which can be based on temperature sensitivity slope).

$$\text{autoINF} = B1 + \text{slope} \cdot (\text{current console temperature (degrees C.)} - \text{console temperature at installation (degrees C.)}) \quad \text{EQUATION 1}$$

where B1=instrument specific normalization factor, typically measured at installation, taken using a concentration standard. B1, in particular embodiments, can be calculated as B1=(average concentration standard integral (e.g., TMA integral)/concentration standard (e.g., TMA) reference bottle integral).

Fitting a graph of the integral of the analyte peak versus temperature to a straight line, an average slope can be used. In Equation 1, "slope" can refer to a slope of analyte peak versus temperature of the respective NMR analyzer or an average or median slope taken from slopes of analyte peaks versus temperature of different NMR analyzers. As noted above, the instrument "normalization factor at installation" is a value obtained using the integral of the concentration standard (e.g., TMA) to produce an integral value at a defined or known temperature "console temperature at installation" that allows the instrument to yield normalized outputs substantially identical with other NMR analyzers of like kind defined above, and "current console temperature" is a value reflecting temperature obtained proximate to or during NMR signal acquisition using the at least one temperature sensor 30.

Each NMR console 16 may have different sensitivity vs. temperature slopes or substantially similar slopes. For the linear model temperature sensitivity adjustment, each NMR analyzer 10 can be configured to establish an instrument-specific response profile or slope at field installation or at an OEM or assembly site (using a defined evaluation protocol and controlled temperature exposure). This response profile or slope can use the same mathematical (known) relationship of NMR integral (signal) versus temperature, instrument to instrument, but the slope or numerical values of the profile/response may vary (signal versus temperature) instrument to instrument.

In some embodiments, the temperature slope can be determined in the field at installation using temperature data from a smaller temperature range that is estimated or projected outside this range to the defined total operating temperate range. This field data can be integrated with a "standard" response slope as discussed below to establish the adjustment slope or be used to establish an instrument specific slope without using slope data from other instruments.

In some embodiments, a hybrid model may be used so that the NMR analyzer 10 employs a first model for a temperature range corresponding to an NMR console temperature within about a first temperature range +/3 degrees C. (5 degrees F.) of an installation temperature based and a second "standard" model outside this first temperature range. The first model may be determined at field installation while the second standard model can be provided based on data from other analyzers/consoles.

In some embodiments, a "standard" slope for temperature correction can be used on different NMR analyzers 10. This data can be provided as an auto-INF programmatically carried out calculation that can be programmed into a respective NMR analyzer 10. This may be particularly suitable for labs that do not anticipate using the full range of temperatures (e.g., 60-85 degrees F. or 63-75 degrees F.). During installation, the NMR analyzer 10 can include a slope assessment mode to measure the TMA integral as a function of mixer temperature and see if the data onsite substantially agrees with that associated with the standard slope. In some embodiments, the "standard" response profile or slope can be established using data from a "master" NMR console or portion thereof or from a plurality of representative NMR consoles, e.g., at least 2, typically at least 3-10, for each NMR console 16 model. Different NMR probes 32 (and versions thereof), console configurations or suppliers thereof, placement of the at least one temperature sensor 30 and the like, may result in different response profiles. Thus, any "standard" response used for temperature sensitivity adjustment may be based on like kind models. For example, a median or average of slopes, where used, or other data from response profiles (signal versus temperature) can be used to generate a "standard" response profile that is used for production NMR analyzers 10. Any NMR analyzer 10 at a field site operating with a first response profile or slope may be updated over time to use data taken over subsequently produced analyzers.

Table 1 includes data from a test ("pilot") NMR analyzer 10 which was placed in an enclosed temperature controlled chamber. NMR sensitivity vs. temperature was measured, then this data was used to test the auto-INF algorithm's performance. Multiple TMA samples were run at 75 degrees F., 69 degrees F. and 63 degrees F. and their integrals were averaged. Plasma samples were also ran at the three temperatures (data not shown) to verify that the NMR LipoProfile® analysis worked over the wide temperature range. Table 1 below shows that with the auto-INF operating with the correct slope for the pilot instrument, the system produced excellent results. If no temperature compensation was used, the results would have changed approximately 5.7% over the temperature range but with the auto-INF on, the results for the TMA integral varied by about 0.5%. The temperatures in the data discussed in the Tables used for developing the linear or non-linear models for the adjustment are based on on-board (e.g., mixer) temperatures over a temperature range in a lab. As described herein, the system performance can be defined based on the ambient room temperature (e.g., lab temperature).

TABLE 1

Summary of Auto-INF Performance as a Function of Temperature For Pilot Unit

| | Chamber temperature | | | |
|---|---|---|---|---|
| | 75 | 69 | 63 | Range |
| AutoINF TMA Integral | 4551 | 4573 | 4558 | 22 |
| Raw TMA Integral | 4818 | 4963 | 5079 | 261 |

This data can be normalized so that the integral at 75 degrees F. is 100 as shown in Table 2 and FIG. 7. Other temperatures may be selected for the normalized adjustment.

TABLE 2

Normalized Summary of Auto-INF Integral Performance as a Function of Temperature

| | Chamber temperature ° F. | | | |
|---|---|---|---|---|
| | 75 | 69 | 63 | % Range |
| AutoINF Integral | 100 | 100.5 | 100.2 | 0.5 |
| Raw Integral | 105.9 | 109.1 | 111.6 | 5.7 |

In use, the temperature sensor 30 can be monitored so that a reading is obtained approximately every 2-30 seconds, typically about every 10 seconds. The high, low, median or average reading of a plurality of readings taken when a biosample is in a test location can be stored in a history record, e.g., database. In particular embodiments, a running average of the last 3-10 readings, such as about 7, including readings obtained prior to signal acquisition, during signal acquisition, and/or just after completion of signal acquisition of a spectrum of a respective biosample can be maintained in the database (correlated to date/time and/or patient sample). When a spectrum is acquired the (running) average temperature of the console 16 can be saved in memory with the spectrum data and this temperature can be used in the sensitivity correction.

Equation 2 reflects another embodiment of the adjustment calculation which uses the average slope from four (Agilent 400MR) NMR consoles 16.

AutoINF={1/(1+$B1$+$B2$*(current console temperature−average console temp when slope was determined)}     EQUATION 2 where $B1$=Sensitivity_Const=(average TMA integral/TMA bottle integral)−1 where $B1$ is instrument-specific and $B2$= (Avg.) Sensitivity_Slope. The value of $B2$ is the average of the slopes from different NMR consoles of a particular type (e.g., four Agilent 400MR consoles), and "console temp" is the current temperature of the NMR console (running average).

In some embodiments, the NMR analyzer 10 can be configured to request (via the HMI or display 12) that a standard TMA solution to be input into the instrument. The NMR analyzer 10 can run an "auto-calibration" routine that may be required to be executed prior to allowing biosamples to be evaluated or run. All or portions of the auto-calibration routine may be run each shift, daily or at other intervals (including more frequently) or less frequently, according to whether certain parameters are detected to be outside defined operational limits. For further discussion of auto-calibration routines, see, U.S. patent application Ser. No. 11/093,596 (US 2005/0222504), the contents of which are incorporated by reference as if recited in full herein. Daily (or at other intervals) calibration can confirm that the NMR instrument passes defined operational specifications. This includes obtaining the integral of the concentration standard solution. This integral measurement can utilize the autoINF measurement.

The effect of temperature on the calibration results can also be part of testing. The three calibration values that are most affected by temperature are: the concentration standard integral, the spectrum phase and the length of the 90 degree pulse width (PW90). The concentration standard integral may be adjusted by using the auto-INF and the phase has a fairly wide tolerance that can be updated by running the calibration again. The PW90 limits are typically defined at installation. However, too much of an ambient temperature change in the room may make the automated calibration routine/evaluation fail but for most scenarios the PW limits are set to allow typical lab environment fluctuation.

As will be appreciated by one of skill in the art, the present invention may be embodied as an apparatus, a method, a data or signal processing system, and/or a computer program product. Accordingly, as noted above, the present invention may take the form of an entirely software embodiment, or an embodiment combining software and hardware aspects (as used herein, "software" or "software and hardware" can both be described as a "circuit" as noted above). Furthermore, certain embodiments of the present invention may take the form of a computer program product on a computer-usable storage medium having computer-usable program code means embodied in the medium. Any suitable computer readable medium may be utilized including hard disks, CD-ROMs, optical storage devices, or magnetic storage devices.

The computer-usable or computer-readable medium may be, but is not limited to, an electronic, magnetic, optical, superconducting magnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium, upon which the program is printed, as the program can be electronically captured, via, for instance, optical scanning of the paper or other medium, then compiled, interpreted or otherwise processed in a suitable manner if necessary, and then stored in a computer memory.

Computer program code for carrying out operations of the present invention may be written in an object oriented programming language such as Java7, Smalltalk, Python, Labview, C++, or VisualBasic. However, the computer program code for carrying out operations of the present invention may also be written in conventional procedural programming languages, such as the "C" programming language or even assembly language.

The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The flowcharts and block diagrams of certain of the figures herein illustrate the architecture, functionality, and operation of possible implementations of analysis models and evaluation systems and/or programs according to the present invention. In this regard, each block in the flow charts or block diagrams represents a module, segment, operation, or portion of code, which comprises one or more executable instructions for implementing the specified logical function(s). It should also be noted that in some alternative implementations, the functions noted in the blocks may occur out of the order and/or out of the blocks noted in the figures. For example, two blocks shown in succession may in fact be executed substantially concurrently or the blocks may sometimes be executed in the reverse order, depending upon the functionality involved.

Figure 8:
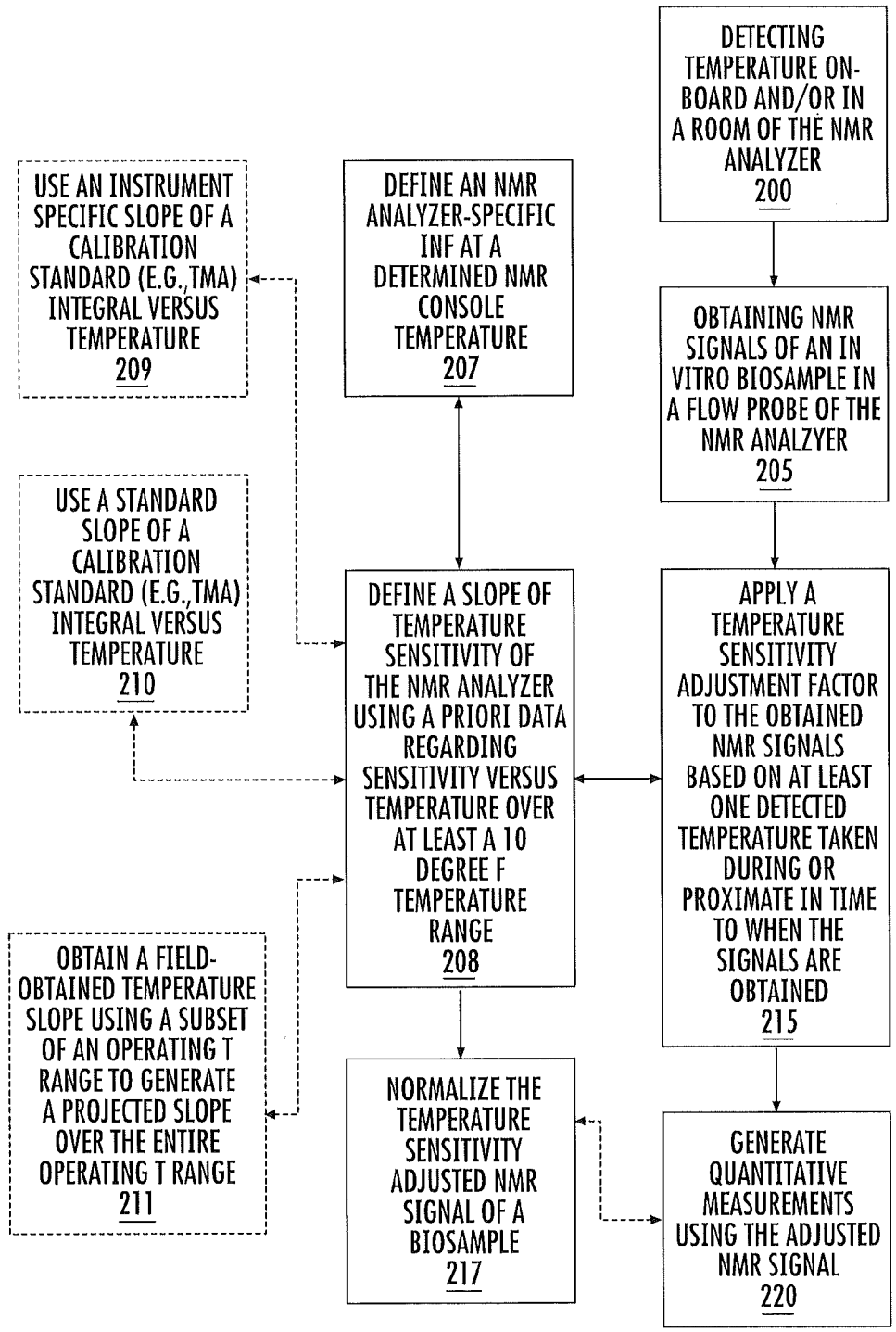
FIG. 8 is a flow chart of exemplary operations that can be used to carry out embodiments of the present invention.

FIG. 8 illustrates exemplary method steps that can be used to perform certain operations according to embodiments of the present invention. Temperature on-board and/or in room of the NMR analyzer is detected (block 200). NMR signals of an in vitro biosample in a flow probe of the NMR analyzer are obtained (block 205). A temperature sensitivity adjustment factor is electronically applied to the obtained NMR signals based on at least one detected temperature taken during or proximate in time to the obtained signals (block 210). At least one quantitative measurement is generated using the adjusted NMR signal (block 220).

In some embodiments, an NMR analyzer-specific INF is determined at a known NMR console temperature prior to active patient sample testing, such as at installation (block 207). A slope of temperature sensitivity of the NMR analyzer can be defined using a priori data regarding sensitivity versus temperature over at least a 10 degree F. temperature range (block 208), typically about 12 degree F. (7 degree C.) range.

The slope can be an instrument specific slope of a calibration standard (e.g., TMA) integral versus temperature (block 209). The slope can be a standard slope of a calibration standard (e.g., TMA) integral versus temperature (block 210). The slope can be defined using a field-obtained temperature slope based on a subset of an operating Temperature range (e.g., 3-6 degrees F. versus 10-12 degrees F.) to generate a projected slope over the entire operating Temperature range (block 211).

Figure 9:
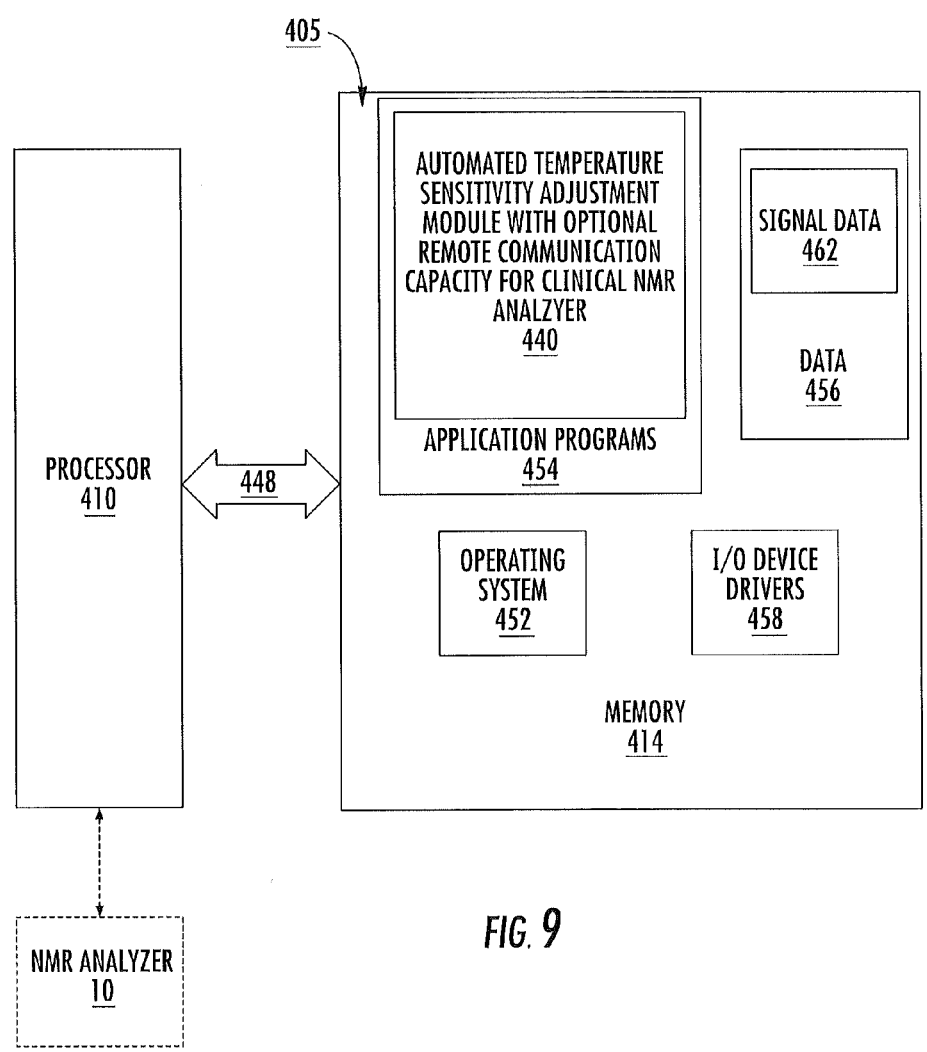
FIG. 9 is a schematic diagram of a data processing system according to embodiments of the present invention.

FIG. 9 is a schematic illustration of a circuit or data processing system 405 that can be used with or forms part of the system 10. The circuits and/or data processing systems 405 data processing systems may be incorporated in a digital signal processor in any suitable device or devices. As shown in FIG. 9, the processor 410 communicates with the NMR analyzer 10 (and may be an onboard processor or a remote processor) and with memory 414 via an address/data bus 448. The processor 410 can be any commercially available or custom microprocessor. The memory 414 is representative of the overall hierarchy of memory devices containing the software and data used to implement the functionality of the data processing system. The memory 414 can include, but is not limited to, the following types of devices: cache, ROM, PROM, EPROM, EEPROM, flash memory, SRAM, and DRAM.

As shown in FIG. 9 illustrates that the memory 414 may include several categories of software and data used in the data processing system: the operating system 452; the application programs 454; the input/output (I/O) device drivers 458; and data 456. The data 456 can include temperature data. FIG. 9 also illustrates the application programs 454 includes an Automated Temperature Sensitivity Adjustment Module with Optional Remote Communication 440 (which can be all or part of the circuit 140 at FIG. 2, 5).

As will be appreciated by those of skill in the art, the operating systems 452 may be any operating system suitable for use in rapid data processing, including, but not limited to those from Microsoft, Inc. (Windows), Apple Computer, Inc. (MacOS), Wind River (VxWorks), RedHat (Linux), LabView or proprietary operating systems. For example, VxWorks which can run on the Scanner's sequence generator for precise control of pulse sequence waveform timings. The I/O device drivers 458 typically include software routines accessed through the operating system 452 by the application programs 454 to communicate with devices such as I/O data port(s), data storage 456 and certain memory 414 components. The application programs 454 are illustrative of the programs that implement the various features of the data processing system and can include at least one application, which supports operations according to embodiments of the present invention. Finally, the data 456 represents the static and dynamic data used by the application programs 454, the operating system 452, the I/O device drivers 458, and other software programs that may reside in the memory 414.

While the present invention is illustrated, for example, with reference to the Module 440 being application programs in FIG. 9, as will be appreciated by those of skill in the art, other configurations may also be utilized while still benefiting from the teachings of the present invention. For example, the Module 440 and/or may also be incorporated into the operating system 452, the I/O device drivers 458 or other such logical division of the data processing system. Thus, the present invention should not be construed as limited to the configuration of FIG. 9 which is intended to encompass any configuration capable of carrying out the operations described herein. Further, Module 440 can communicate with or be incorporated totally or partially in other components, such as NMR analyzer 10 and/or remote computer 15R or server (or the Cloud).

The I/O data port can be used to transfer information between the data processing system, the analyzer, and another computer system or a network (e.g., the Internet) or to other devices controlled by the processor. These components may be conventional components such as those used in many conventional data processing systems, which may be configured in accordance with the present invention to operate as described herein.

In certain embodiments, the automation module 440 may include computer program code for communicating with a remote control system (local or offsite). The automation module 440 can also include or be in communication with program code that provides: automated multi-parameter process monitoring, temperature of at least one on-board sensor (and optionally an internal and external temperature sensor (external to the housing of the analyzer) to monitor ambient conditions, a log of operational conditions that may be correlated to patient samples (including time/date data), selectable test formats and selectable test analysis, a log of data variability and/or service history, a log of the number of patient samples processed (which may be parsed over desired intervals), and archived process parameter information for remote interrogation, diagnostics, and other data as indicated above.

In particular embodiments, every NMR console 16 and probe 32 combination will produce a unique value for the integral of the TMA solution run under standard conditions. The INF, which when multiplied by the integral of the concentration standard, will produce an integral value that is identical with the other like-kind NMR analyzers that are operating in the field and/or a central facility. When this instrument sensitivity is measured at installation, the INF is saved in the system software and all subsequent samples will be multiplied by this value. Now recognizing that the NMR sensitivity can depend on the NMR console temperature (which depends on ambient temperature), the INF value can be stored in the software along with the temperature at which it was determined. The sensitivity vs. temperature slope for an NMR system/NMR console can be utilized and an appropriate correction value is used to electronically change the output of the system 10, corrected for the sensitivity difference between the temperature at which the sample was run and the temperature at which the instrument was installed (or another suitable baseline temperature).

Embodiments of the present invention will now be discussed with respect to the following non-limiting Examples.

Examples

Testing Agilent 400MR Consoles Performance as a Function of Temperature

Three identical consoles that had already been through the initial pre-assembly process at a vendor/supplier, and one new NMR console that came directly from Agilent Technologies Inc. were analyzed for temperature sensitivity. All four of the consoles' performance was measured (serially) in a controlled temperature range from 63-80 degrees F. in a temperature chamber. The chamber was a constructed modular 8'×8'×16' Styrofoam lined room that could be placed around an instrument and heated or cooled as desired. Temperature loggers were placed around the walls of the temperature chamber and several inside the NMR console cabinet. Calibration and TMA assays were run. The most recent console from Agilent Technologies, Inc. was different from the previous three because it had two fans on the card cage to improve air flow and hopefully improve the lifetime of some of the boards in the card cage.

All of these tests were done with the same Vantera® NMR analyzer operating system (sample handler, testing software, exterior housing). The only component that was switched between tests was the NMR console. The general testing procedure was carried out to start at 80 degrees F. and slowly cool down the chamber while two back to back auto-calibration tests were run followed by 3 TMA assay tests. At the start of the experiment, the flow cell was filled with TMA solution via a hand syringe and refilled as needed during the experiment. The cycle of 2 calibrations and 3 TMA assays took approximately 20 minutes and the cycle was repeated continuously until the final temperature of about 63 degrees F. was reached. If the experiment could not be completed in one day, the experiment was started the next day making sure that there was overlap between the final temperature from the previous day and the starting temperature. A summary of the data is in Table 3 below. The slopes listed in Table 3 are for a least squares line fit to the data. To get a percent change in slope, the slope was divided by the integral value produced when the console temperature was 31 degrees C.

TABLE 3

Summary of Agilent 400MR Console Performance as a Function of Ambient Temperature

|  | Console A (Gen 3) | Console B (Gen 3) | Console C (Gen 3) | Console D* (Gen 4) Card cage fans ON |
|---|---|---|---|---|
| Lab Temperature Range | 80 − 63 = 17° F. 26.7 − 17.2 = 9.5° C. | 80 − 63 = 17° F. 26.7 − 17.2 = 9.5° C. | 80 − 63 = 17° F. 26.7 − 17.2 = 9.5° C. | 76 − 63 = 13° F. 24.4 − 17.2 = 7.2° C. |
| Mixer Temperature Range | 35.3 − 25.4 = 9.9° C. 95.5 − 77.7 = 17.8° F. | 34.3 − 24.6 = 9.7° C. 93.7 − 76.3 = 17.4° F. | 34.4 − 25.4 = 9.0° C. 93.9 − 77.7 = 16.2° F. | 33.15 − 26.46 = 6.7° C. 91.8 − 79.7 = 12.1° F. |
| Slope for TMA assay per degree C. | −70.3/6701 = −1.05% | −81.1/5272 = −1.54% | −77.2/6256 = −1.23% | −58.74/6173 = −.95% |
| Slope for Calibration per degree C. | −68.5/6722 = −1.02% | −80.8/5293 = −1.53% | −72.9/6272 = −1.16% | −57.9/6179 = −0.94% |

TABLE 3-continued

Summary of Agilent 400MR Console Performance as a Function of Ambient Temperature

|  | Console A (Gen 3) | Console B (Gen 3) | Console C (Gen 3) | Console D* (Gen 4) Card cage fans ON |
|---|---|---|---|---|
| Tuning Frequency Range | 399.9367 − 399.8977 = .039 MHz | 399.9367 − 399.8977 = .039 MHz | 399.9367 No Change | 399.9367 − 399.8977 = .039 MHz |
| Match range | 3.94 − .33 = 3.6 (only 2 points were about .33) | 2.39 − 1.79 = .60 | 1.4 − .66 = .74 | 2.05 − 1.25 = .80 |
| PW Range (microsec.) | 4.3 − 3.85 = .45 | 4.45 − 3.95 = .50 | 3.7 − 3.35 = .35 | 4.15 − 3.9 = .25 |
| Phase change/degree C. | 20.8/9.9 = 2.1 | 20.8/9.7 = 2.14 | 16.3/9.0 = 1.81 | 10.7/6.7 = 1.6 |

*An amplifier went bad on the instrument before the experiments were finished so the temps 80-76 were not done.

When the TMA integral data is plotted as a function of the mixer temperature there is a bend to the curve as seen in the graph of FIG. 10. The x-axis shows the difference in the mixer temperature from the mixer temperature at installation. Although the data is best fit with a second order polynomial, it was only slightly better than the linear equation fits for the data. Since all of the consoles have different slopes, the data was normalized and combined to generate an aggregate slope for both the second order polynomial fit (Table 4) and for the linear equation fit (Table 5). The calculated TMA integral for the overall model was compared to each individual model and the percent difference was calculated as the measurement temperature differed from the mixer temperature at installation (approximately 31 degrees C.). The agreement at temperatures near the installation temperature is good. As the temperature gets farther away from the installation temperature, the difference in slopes causes the % difference to increase. If the lab keeps the instrument mixer temperature at +/−3 degrees C., which is about +/−5.4 degrees F. of ambient temperature, this composite model should work well. The composite model may not be suitable in cases where the instrument is installed and initially calibrated at either the high or low end of the temperature range.

TABLE 4

The TMA data fit for a second order polynomial.

| | Normalized to 4510 | | | | | % difference from one overall model | | | |
|---|---|---|---|---|---|---|---|---|---|
| Mixer Temp | Console A | Console B | Console C | Console D | Overall Model | Console A | Console B | Console C | Console D |
| -7 | 110.3 | 111.6 | 108.5 | 108.4 | 110.7 | 0.4 | -0.8 | 2.1 | 2.1 |
| -6 | 109.2 | 110.1 | 107.6 | 107.3 | 109.3 | 0.1 | -0.8 | 1.6 | 1.8 |
| -5 | 107.9 | 108.6 | 106.6 | 106.2 | 107.9 | 0.0 | -0.7 | 1.2 | 1.5 |
| -4 | 106.6 | 107.0 | 105.5 | 105.1 | 106.4 | -0.2 | -0.6 | 0.9 | 1.2 |
| -3 | 105.1 | 105.4 | 104.2 | 103.9 | 104.8 | -0.3 | -0.5 | 0.6 | 0.9 |
| -2 | 103.5 | 103.6 | 102.9 | 102.6 | 103.2 | -0.3 | -0.4 | 0.3 | 0.6 |
| -1 | 101.9 | 101.8 | 101.5 | 101.3 | 101.6 | -0.3 | -0.2 | 0.1 | 0.3 |
| 0 | 100.1 | 99.9 | 99.9 | 100.0 | 99.9 | -0.2 | 0.0 | 0.0 | -0.1 |
| 1 | 98.2 | 98.0 | 98.3 | 98.6 | 98.1 | 0.0 | 0.2 | -0.1 | -0.5 |
| 2 | 96.2 | 96.0 | 96.5 | 97.1 | 96.3 | 0.2 | 0.4 | -0.2 | -0.8 |
| 3 | 94.0 | 93.9 | 94.6 | 95.7 | 94.5 | 0.5 | 0.6 | -0.2 | -1.2 |
| 4 | 91.8 | 91.7 | 92.6 | 94.1 | 92.5 | 0.8 | 0.9 | -0.1 | -1.7* |
| 5 | 89.4 | 89.5 | 90.5 | 92.5 | 90.6 | 1.3 | 1.2 | 0.1 | -2.1* |
| 6 | 87.0 | 87.2 | 88.3 | 90.9 | 88.5 | 1.8 | 1.6 | 0.3 | -2.6* |
| 7 | 84.4 | 84.8 | 86.0 | 89.2 | 86.5 | 2.4 | 1.9 | 0.5 | -3.0* |

TABLE 5

The TMA data fit to a linear equation.

| Mixer Temp | Normalized to 4510 | | | | | % difference from one overall model | | | |
|---|---|---|---|---|---|---|---|---|---|
| | Console A | Console B | Console C | Console D | Overall Model | Console A | Console B | Console C | Console D |
| -7 | 111.7 | 112.3 | 110.3 | 109.1 | 111.4 | -0.3 | -0.8 | 1.0 | 2.1 |
| -6 | 110.0 | 110.5 | 108.8 | 107.8 | 109.7 | -0.3 | -0.7 | 0.9 | 1.8 |
| -5 | 108.3 | 108.7 | 107.2 | 106.5 | 108.1 | -0.2 | -0.6 | 0.8 | 1.5 |
| -4 | 106.6 | 106.9 | 105.7 | 105.2 | 106.4 | -0.2 | -0.5 | 0.7 | 1.2 |
| -3 | 104.9 | 105.1 | 104.1 | 103.9 | 104.7 | -0.1 | -0.4 | 0.6 | 0.8 |
| -2 | 103.2 | 103.3 | 102.6 | 102.6 | 103.1 | -0.1 | -0.3 | 0.5 | 0.5 |
| -1 | 101.4 | 101.6 | 101.0 | 101.2 | 101.4 | 0.0 | -0.2 | 0.4 | 0.2 |
| 0 | 99.7 | 99.8 | 99.5 | 99.9 | 99.7 | 0.0 | 0.0 | 0.2 | -0.2 |
| 1 | 98.0 | 98.0 | 97.9 | 98.6 | 98.1 | 0.1 | 0.1 | 0.1 | -0.6 |
| 2 | 96.3 | 96.2 | 96.4 | 97.3 | 96.4 | 0.1 | 0.2 | 0.0 | -0.9 |
| 3 | 94.6 | 94.4 | 94.8 | 96.0 | 94.7 | 0.2 | 0.3 | -0.1 | -1.3 |
| 4 | 92.8 | 92.6 | 93.3 | 94.7 | 93.0 | 0.2 | 0.5 | -0.3 | -1.7 |
| 5 | 91.1 | 90.8 | 91.7 | 93.3 | 91.4 | 0.3 | 0.6 | -0.4 | -2.1* |
| 6 | 89.4 | 89.0 | 90.2 | 92.0 | 89.7 | 0.3 | 0.8 | -0.5 | -2.5* |
| 7 | 87.7 | 87.2 | 88.6 | 90.7 | 88.0 | 0.4 | 0.9 | -0.7 | -2.9* |

The few darker boxes indicate where the TMA integral would be outside the +/− 2% goal for accuracy.
*Console D was not tested between 76-80 degrees F. so the high temperature values are extrapolated and have high uncertainly.

The Auto-INF Slope May be Measured in the Field at Installation

Measuring the INF slope in the field can save time and potentially provide better assurance of performance. With the assumption that the service engineer or technician would likely not be able to expose the analyzer to the full operational temperature range in the normal lab temperature environment, it is envisioned that smaller temperature range may be used. The data from larger temperature runs was broken up in to smaller temperature ranges to see if they would predict the overall slope properly. The data is in Tables 6-9.

TABLE 6

Comparison of slope for small temperature ranges compared to the slope for the total temperature range for console A
Console A

| Mixer Temperature | 34.4-32.5 | 32.0-29.8 | 29.6-27.1 | full linear | full 2nd order | % difference from Linear model | | |
|---|---|---|---|---|---|---|---|---|
| | | | | | | 34.4-32.5 | 32.0-29.8 | 29.6-27.1 |
| 35 | 5914 | 5999 | 5954 | 5948 | 5900 | 0.6 | -0.9 | -0.1 |
| 34 | 6001 | 6065 | 6033 | 6025 | 6001 | 0.4 | -0.7 | -0.1 |
| 33 | 6088 | 6132 | 6112 | 6103 | 6097 | 0.2 | -0.5 | -0.2 |
| 32 | 6175 | 6198 | 6191 | 6180 | 6188 | 0.1 | -0.3 | -0.2 |
| 31 | 6262 | 6265 | 6269 | 6258 | 6273 | -0.1 | -0.1 | -0.2 |
| 30 | 6349 | 6332 | 6348 | 6335 | 6354 | -0.2 | 0.1 | -0.2 |
| 29 | 6436 | 6398 | 6427 | 6413 | 6430 | -0.4 | 0.2 | -0.2 |
| 28 | 6523 | 6465 | 6506 | 6490 | 6501 | -0.5 | 0.4 | -0.2 |
| 27 | 6610 | 6531 | 6584 | 6567 | 6567 | -0.6 | 0.6 | -0.3 |
| 26 | 6697 | 6598 | 6663 | 6645 | 6627 | -0.8 | 0.7 | -0.3 |
| 25 | 6784 | 6664 | 6742 | 6722 | 6683 | -0.9 | 0.9 | -0.3 |

TABLE 7

Comparison of slope for small temperature ranges compared to the slope for the total temperature range for console C
Console C

| Mixer Temperature | 35.3-33.1 | 32.7-30.4 | 30.1-27.5 | full linear | full 2nd order | % difference from Linear model | | |
|---|---|---|---|---|---|---|---|---|
| | | | | | | 35.3-33.1 | 32.7-30.4 | 30.1-27.5 |
| 35 | 6395 | 6411 | 6482 | 6419 | 6389 | 0.4 | 0.1 | -1.0 |
| 34 | 6473 | 6489 | 6544 | 6489 | 6479 | 0.3 | 0.0 | -0.8 |
| 33 | 6550 | 6567 | 6605 | 6559 | 6564 | 0.1 | -0.1 | -0.7 |
| 32 | 6628 | 6645 | 6667 | 6629 | 6644 | 0.0 | -0.2 | -0.6 |
| 31 | 6706 | 6723 | 6728 | 6698 | 6718 | -0.1 | -0.4 | -0.4 |
| 30 | 6784 | 6801 | 6790 | 6768 | 6788 | -0.2 | -0.5 | -0.3 |
| 29 | 6861 | 6879 | 6851 | 6838 | 6853 | -0.3 | -0.6 | -0.2 |
| 28 | 6939 | 6957 | 6913 | 6908 | 6913 | -0.5 | -0.7 | -0.1 |
| 27 | 7017 | 7035 | 6975 | 6977 | 6968 | -0.6 | -0.8 | 0.0 |
| 26 | 7095 | 7112 | 7036 | 7047 | 7018 | -0.7 | -0.9 | 0.2 |
| 25 | 7172 | 7190 | 7098 | 7117 | 7064 | -0.8 | -1.0 | 0.3 |

TABLE 8

Comparison of slope for small temperature ranges compared to the slope for the total temperature range for console B
Console B

| Mixer Temperature | 34.0-31.8 | 31.4-29.2 | 28.8-26.3 | full linear | full 2nd order | % difference from Linear model | | |
|---|---|---|---|---|---|---|---|---|
| | | | | | | 34.0-31.8 | 31.4-29.2 | 28.8-26.3 |
| 35 | 4892 | 4981 | 4899 | 4949 | 4908 | 1.1 | -0.7 | 1.0 |
| 34 | 4995 | 5058 | 4986 | 5029 | 5006 | 0.7 | -0.6 | 0.9 |
| 33 | 5099 | 5135 | 5074 | 5110 | 5100 | 0.2 | -0.5 | 0.7 |
| 32 | 5202 | 5212 | 5161 | 5191 | 5191 | -0.2 | -0.4 | 0.6 |
| 31 | 5305 | 5288 | 5249 | 5271 | 5279 | -0.6 | -0.3 | 0.4 |
| 30 | 5408 | 5365 | 5336 | 5352 | 5364 | -1.0 | -0.2 | 0.3 |

TABLE 8-continued

Comparison of slope for small temperature ranges compared to the slope for the total temperature range for console B
Console B

| | | | | | | % difference from Linear model | | |
|---|---|---|---|---|---|---|---|---|
| Mixer Temperature | 34.0-31.8 | 31.4-29.2 | 28.8-26.3 | full linear | full 2nd order | 34.0-31.8 | 31.4-29.2 | 28.8-26.3 |
| 29 | 5512 | 5442 | 5424 | 5433 | 5445 | −1.4 | −0.2 | 0.2 |
| 28 | 5615 | 5519 | 5512 | 5514 | 5523 | −1.8 | −0.1 | 0.0 |
| 27 | 5718 | 5595 | 5599 | 5594 | 5599 | −2.2 | 0.0 | −0.1 |
| 26 | 5821 | 5672 | 5687 | 5675 | 5671 | −2.6 | 0.1 | −0.2 |
| 25 | 5925 | 5749 | 5774 | 5756 | 5739 | −2.9 | 0.1 | −0.3 |

TABLE 9

Comparison of slope for small temperature ranges compared to the slope for the total temperature range for console D
Console D

| | | | | | | % difference from Linear model | |
|---|---|---|---|---|---|---|---|
| Mixer Temperature | 33.2-30.8 | 30.5-27.5 | full linear | full 2nd order | | 33.2-30.8 | 30.5-27.5 |
| 35 | 5914 | 5952 | 5936 | 5911 | | 0.4 | −0.3 |
| 34 | 5981 | 6009 | 5995 | 5981 | | 0.2 | −0.2 |
| 33 | 6047 | 6066 | 6055 | 6048 | | 0.1 | −0.2 |
| 32 | 6113 | 6122 | 6114 | 6114 | | 0.0 | −0.1 |
| 31 | 6179 | 6179 | 6174 | 6177 | | −0.1 | −0.1 |
| 30 | 6246 | 6236 | 6233 | 6237 | | −0.2 | −0.1 |
| 29 | 6312 | 6293 | 6292 | 6296 | | −0.3 | 0.0 |
| 28 | 6378 | 6350 | 6352 | 6352 | | −0.4 | 0.0 |
| 27 | 6444 | 6407 | 6411 | 6407 | | −0.5 | 0.1 |
| 26 | 6511 | 6464 | 6470 | 6458 | | −0.6 | 0.1 |
| 25 | 6577 | 6521 | 6530 | 6508 | | −0.7 | 0.1 |

This console did not undergo testing from 76-80 degrees F.

The models with the smaller temperature range generally did well when the temperature difference was within a few degrees of the installation temperature (31 degrees C.), but the error usually approached the 1% mark at the edges of the temperature range. This data was collected under ideal conditions where many good samples evenly distributed over the desired temperature range could be obtained. Table 10 shows the slope of the mixer temperature vs. TMA integral for the individual segments compared to the entire data set. In all cases the uncertainty in the slope is much higher for the shorter temperature ranges. For most of the shorter ranges the slope uncertainty is in the range of +/−10%.

TABLE 10

Comparison of Mixer Temperature vs. TMA Integral Slope for Short Temperature Ranges and the Entire Data Set

| Instrument | temperature range | slope | uncertainty +/− |
|---|---|---|---|
| Console A | 34.4-32.5 | −87.0 | 8.9 |
| Console A | 32.0-29.8 | −66.5 | 6.6 |
| Console A | 29.6-27.1 | −78.7 | 6.6 |
| Console A | ALL Data | −77.4 | 1.8 |
| Console C | 35.3-33.1 | −77.7 | 9.5 |
| Console C | 32.7-30.4 | −78.0 | 8.5 |
| Console C | 30-1-27.5 | −61.6 | 13.5 |
| Console C | All Data | −69.8 | 2.1 |
| Console B | 34.0-31.8 | −103.3 | 6.1 |
| Console B | 31.4-29.2 | −76.7 | 5.7 |
| Console B | 28.8-26.3 | −87.5 | 8.9 |
| Console B | All Data | −80.7 | 1.4 |
| Console D | 33.2-30.8 | −66.3 | 6.7 |
| Console D | 30.5-27.5 | −56.9 | 4.9 |
| Console D | All Data | −59.4 | 1.8 |

Figure 11A:
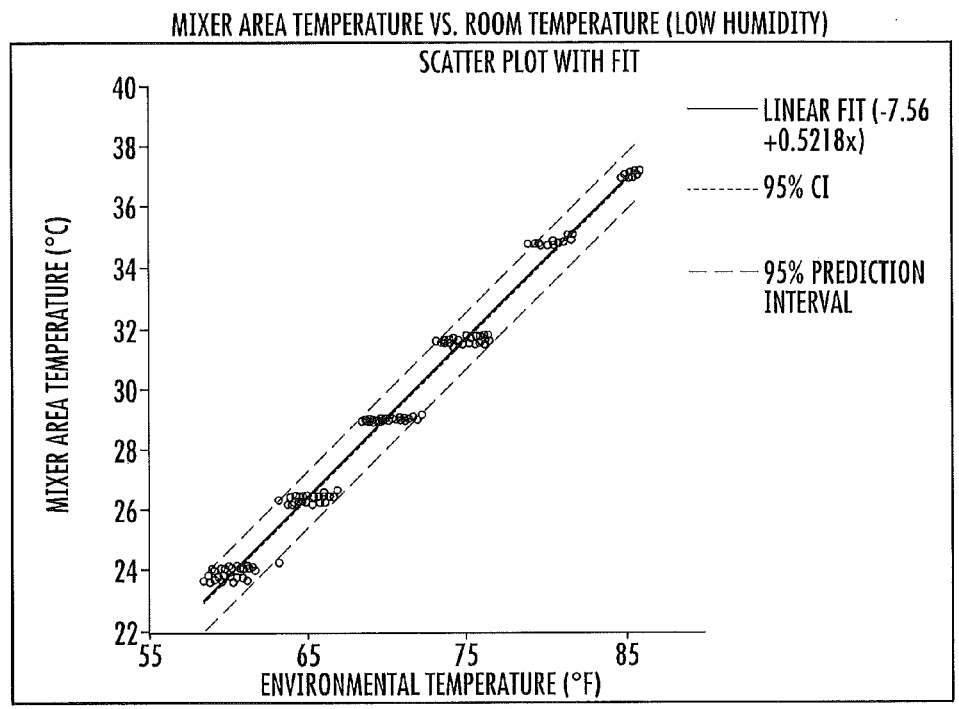
FIG. 11A is a scatter plot of mixer area temperature versus room temperature at low humidity according to embodiments of the present invention.
Figure 11B:
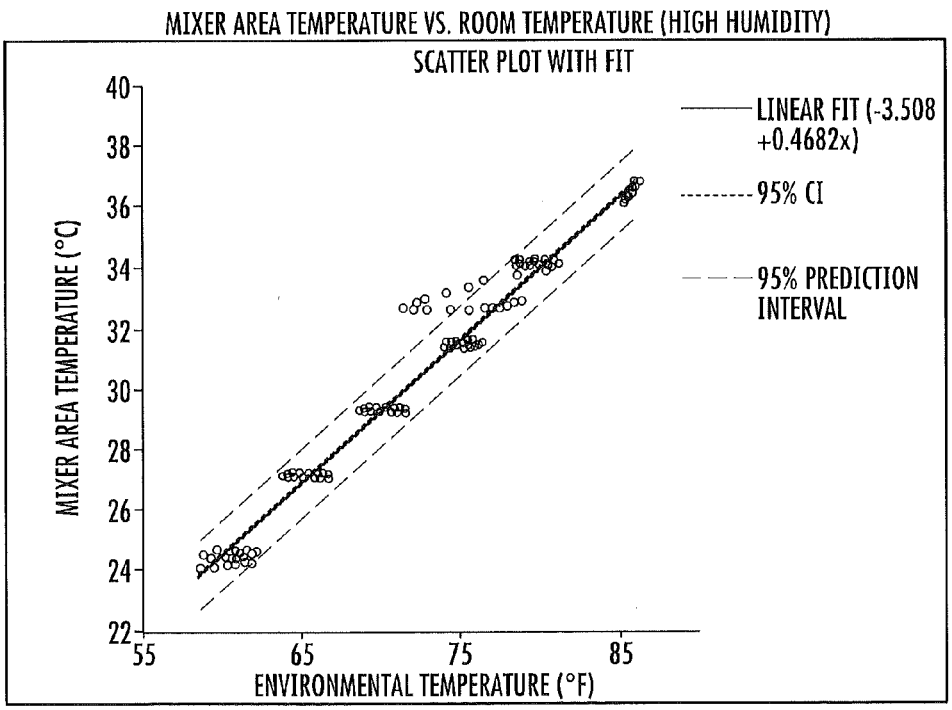
FIG. 11B is, a scatter plot of mixer area temperature (degrees C.) versus room temperature (degrees F.) at high humidity according to embodiments of the present invention.
Figure 14A:
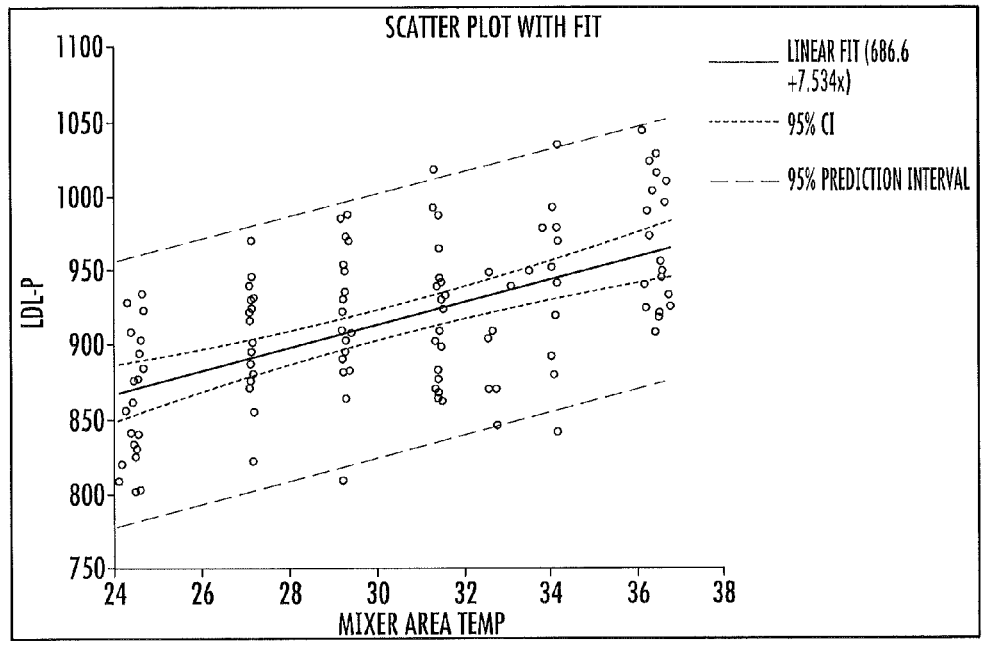
FIG. 14A is a scatter plot with fit of LDL-P concentration (nmol/L) level 1 versus mixer area temperature (degrees C.) at high humidity according to embodiments of the present invention.
Figure 14B:
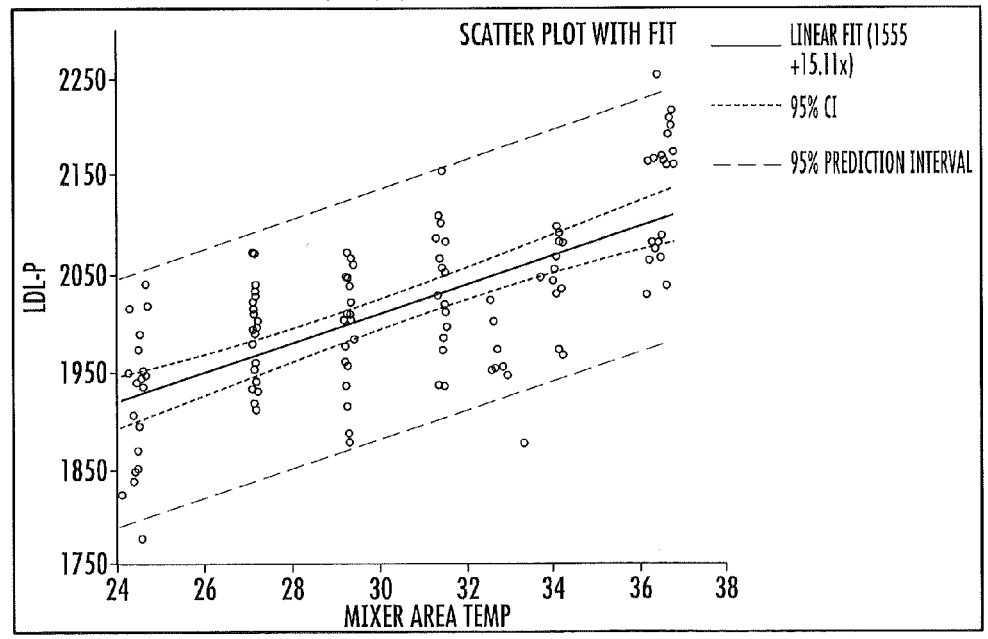
FIG. 14B is a scatter plot with fit of LDL-P concentration (nmol/L) level 2 versus mixer area temperature (degrees C.) at high humidity according to embodiments of the present invention.
Figure 15A:
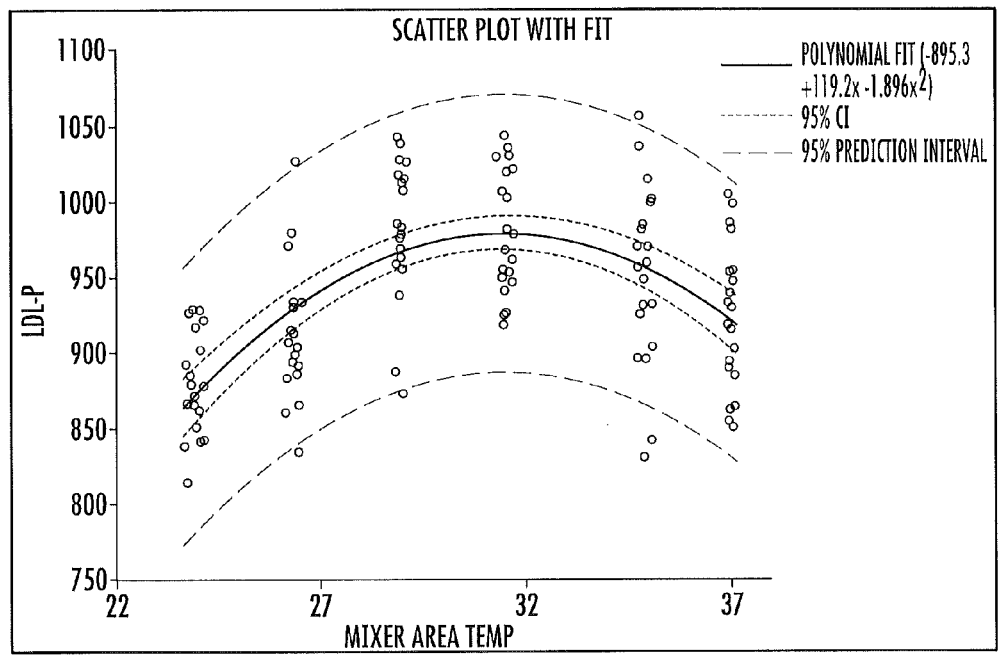
FIG. 15A is a scatter plot with fit of LDL-P concentration (nmol/L) level 1 versus mixer area temperature (degrees C.) at low humidity according to embodiments of the present invention.
Figure 15B:
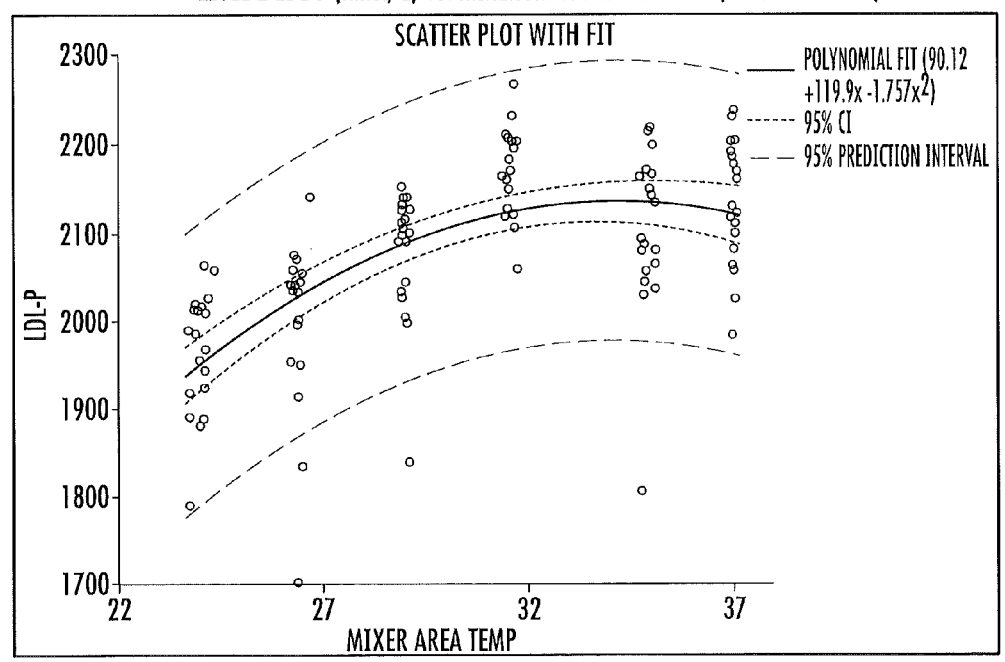
FIG. 15B is a scatter plot of LDL-P concentration (nmol/L) level 2 versus mixer area temperature (degrees C.) at low humidity according to embodiments of the present invention.
Figure 16A:
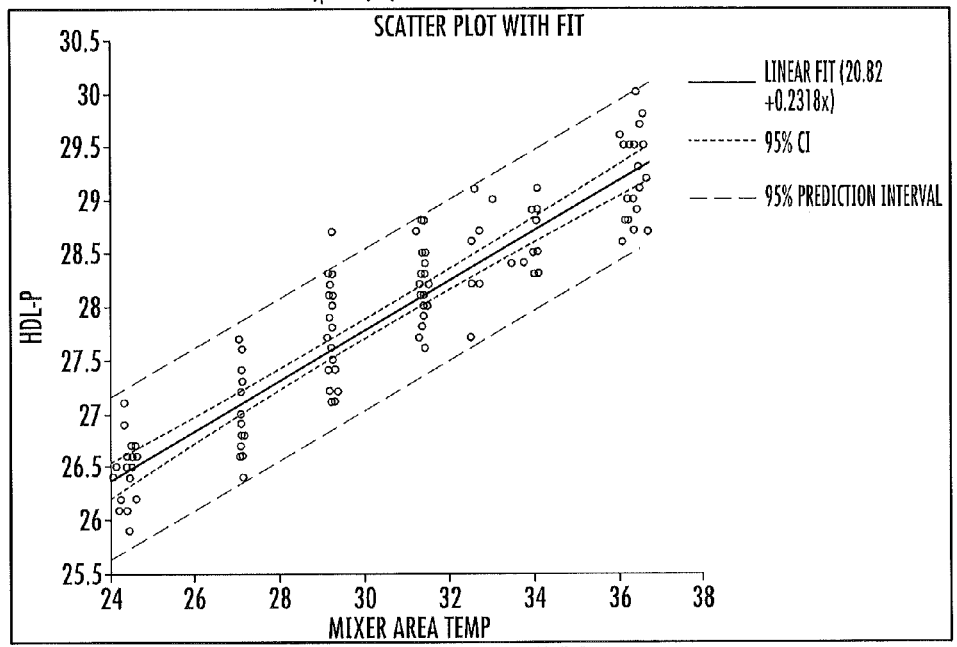
FIG. 16A is a scatter plot with fit of HDL-P concentration (μmol/L) level 1 versus mixer area temperature (degrees C.) at high humidity according to embodiments of the present invention.
Figure 16B:
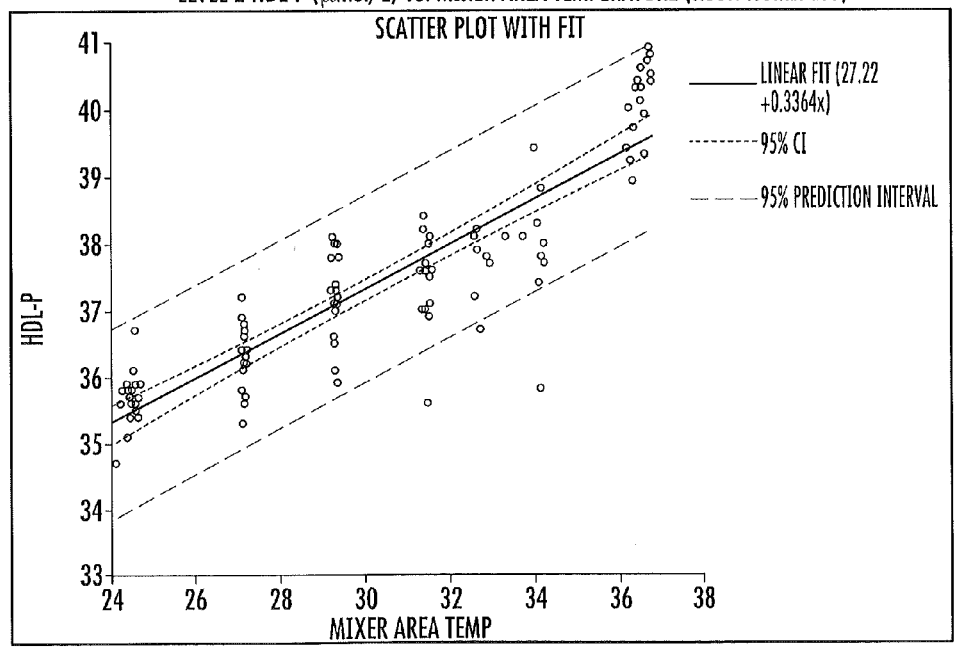
FIG. 16B is a scatter plot with fit of HLDL-P concentration (μmol/L) level 2 versus mixer area temperature (degrees C.) at high humidity according to embodiments of the present invention.
Figure 17A:
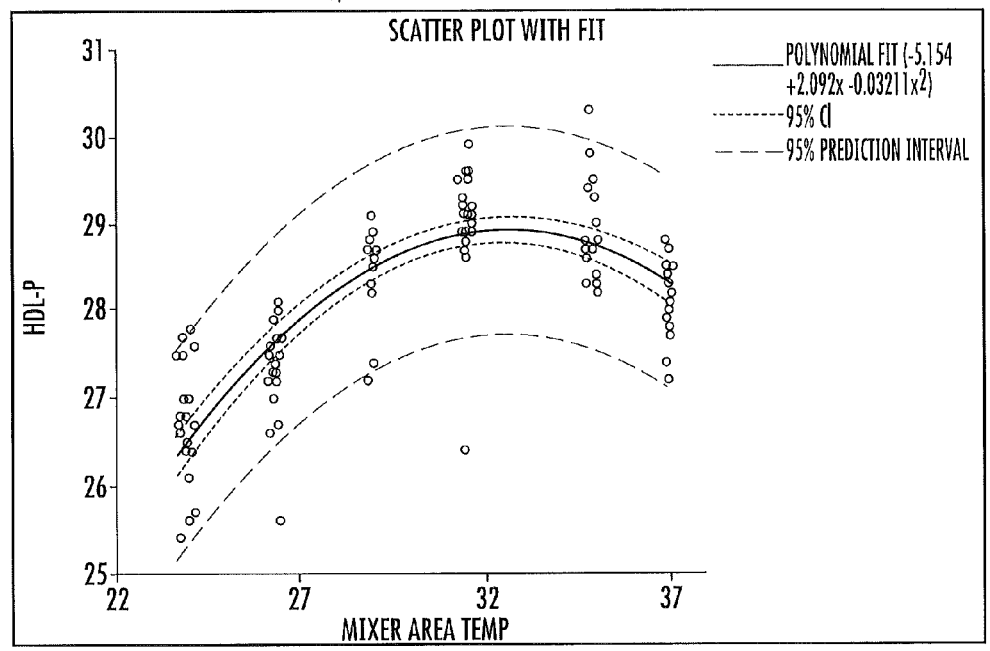
FIG. 17A is a scatter plot with fit of HDL-P concentration (μmol/L) level 1 versus mixer area temperature (degrees C.) at low humidity according to embodiments of the present invention.
Figure 17B:
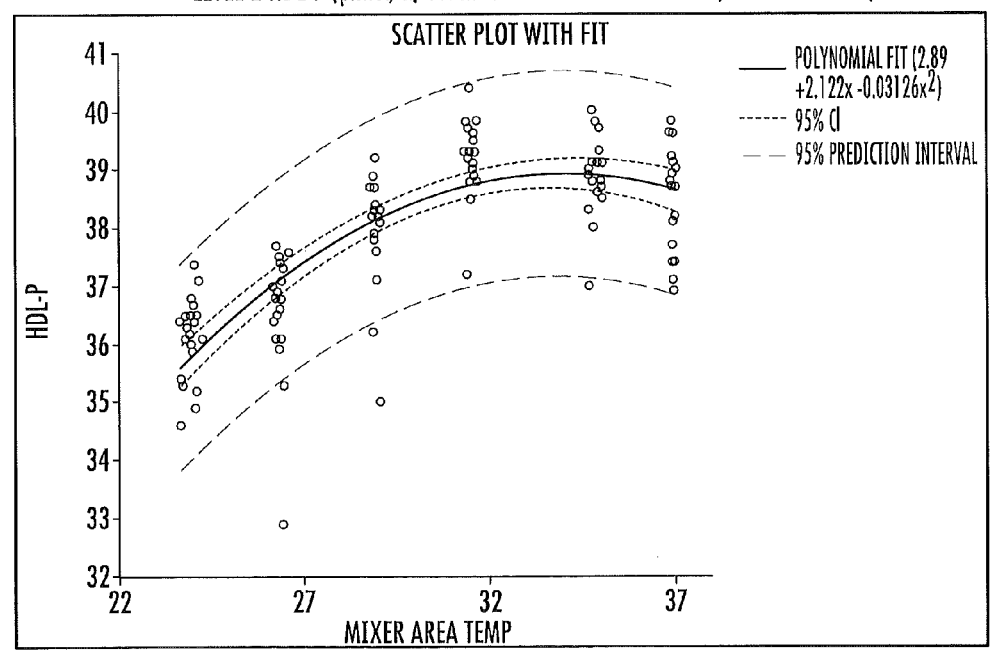
FIG. 17B is a scatter plot with fit of HDL-P concentration level 2 versus mixer area temperature (degrees C.) at low humidity according to embodiments of the present invention.

NMR signals are known to vary in amplitude depending on environmental (ambient room) temperature. FIGS. 11A and 11B show examples of linear regression between the recorded environmental temperature and an example mixer area temperature. As seen in these figures, the mixer area temperature was relatively stable for each test point, whereas the environmental temperature varied as it was controlled over the course of running samples for the test point. Given the relative stability of the mixer area temperature and its more definitive relationship with the NMR signal amplitudes, the mixer area temperature rather than the recorded environmental temperature was used to perform an analyte regression analysis vs. temperature as described further below.

FIGS. 12A and 12B are tables of LDL-P measurements (nmol/L) for two different concentrations of controls versus temperature over a 60-85 degree F. temperature range at low and high humidity, respectively. Low humidity is about 15% while high is about 80%. FIGS. 13A and 13B are Tables of HDL-P measurements (nmol/L) over the same temperature range and low and high humidity conditions.

To generate the data for FIGS. 12A, 12B, 13A and 13B, a custom temperature and humidity chamber was constructed. The enclosure consisted on typical 2 in×4 in construction with double wall insulation. The length×width×height of the enclosure was 16 ft×8 ft×8 ft. The insulation was manufactured by R-Max Inc, model number R-Matte Plus 3. The insulation was a rigid foam plastic thermal insulation board. Two 24,000 BTU air conditioners for cooling and humidity conditioning were used. The units are manufactured by Denso Corporation, model Classic Plus 26. The units had digital temperature control, power of 230V, 60 Hz, 13.8 A. For temperature and humidity monitoring, two data loggers were used by Extech model number 42280. For humidity conditioning, silica gel by the manufacturer Hydrosorbent Products, Inc. was used to lower the humidity. A total of 30 boxes each containing 900 grams of silica gel desiccant were used. For the purpose of humidifying the chamber, two Honeywell QUIETCARE Humidifiers and two Vicks vaporizers were used. To distribute the air flow inside the chamber two small TORNADO fans were used.

For brevity, the mean, standard deviation, and CV % for LDL-P, and HDL-P from the control material are shown in the noted tables. However, TG, HDL-C were also calculated at each temperature and humidity test point. The temperatures in the chart were within about +/−2 degrees and the humidity was believed to be within about +/−5% RH (non-condensing). Each test point met the precision target for each analyte with one exception: the % CV for the level 1 material at 80 degrees F. and low humidity was 6.2%, slightly higher than a normal target % CV of <6%. However, 6.2% is well within the 95% confidence interval observed for within-run precision of samples with low LDL-P concentration.

The second order polynomial regression between each analyte value for each control level vs. mixer area temperature was calculated. In cases where the second order regression term was significant (p<0.05), the polynomial regression was accepted as the relationship between the analyte and temperature, otherwise the linear regression was calculated and accepted. See, e.g., FIGS. 14A, 14B, 15A, 15B, 15C, 15D, 16A and 16B which show the accepted regression for each analyte and control level vs. temperature. The relationship between analyte values and environmental temperature was determined to be polynomial for the low humidity testing and linear for the high humidity testing.

The % Bias vs. temperature was also evaluated based on the mean analyte value at each test point and independently based on the accepted regression equation for each control level and analyte. The study protocol states the reference for the % bias is the test point (across the temperature range) with the lowest mean analyte value. However, the lowest mean analyte value may be a temperature at which unacceptable bias exists (>10%). Instead, the % bias at each test point was evaluated relative to standard ambient temperature, or 77 degrees F. (25 degrees C.). % Bias based on the mean analyte value at a given test point was calculated with respect to the 75 degrees F. test point, as this is the closest test point to standard ambient temperature. % Bias based on the regression equation was calculated with respect to exactly 77 degrees F. since the regression equations for analyte value vs. mixer area temperature and mixer area temperature vs. environmental temperature allow for continuous solution. The regression equation used to calculate the relationship between environmental and mixer area temperature used the equation in FIG. 11A. The % Bias based on each method is summarized for LDL-P and HDL-P in FIGS. 18A, 18B, 19A and 19B. Similar measurements were taken for TG and HDL-C.

The % Bias estimated by the two methods was similar for each test point. One temperature and humidity test point for LDL-P showed unacceptable bias>10%: 60 degrees F. at low humidity. Using the regression equations for LDL-P vs. mixer area temperature for this test point and mixer area temperature vs. environmental temperature as shown below, 10% bias in LDL-P relative to standard ambient temperature occurs at an environmental temperature less than 60.8 degrees F.:

$$32.6° C. = (77° F. * 0.5218) - 7.56$$

$$LDL\text{-}P_{32.6} = -895.3 + (119.2 * 32.6) - (1.896 * 32.6^2) = 975.5 \text{ nmol/L}$$

$$LDL\text{-}P_{10\%} = 0.9 * 975.5 \text{ nmol/L} = 878 \text{ nmol/L}$$

$$LDL\text{-}P_{24.2} = -895.3 + (119.2 * 24.2) - (1.896 * 24.2^2) = 879.0 \text{ nmol/L}$$

$$60.8° F. = (24.2° C. + 7.56)/0.5218$$

This indicates that an environmental temperature of 61 degrees F. yields LDL-P bias less than 10%. The other analytes can be evaluated at 60 degrees F. and be within the % bias target.

The relationship between analyte values and humidity was also examined. Each temperature test point was assessed at relatively low (target 15%) and high (target 80%) humidity. Humidity data were recorded through monitoring of the instrument environment and was observed in the range of 17.5-34.2% for low humidity (mean=22.7%) and 63.2-89.7% for high humidity (mean=77.2%). The % Bias between low and high humidity tests at each temperature were calculated and summarized. Table 11 and 12 show the results for LDL-P and HDL-P.

TABLE 11

LDL-P (nmol/L) % Bias vs. Humidity

| Control Level | Temeprature (° F.) | Mean @ low humidity | Mean @ high humidity | % Bias |
|---|---|---|---|---|
| I673L1 | 60 | 878.8 | 862.4 | -1.9% |
|  | 65 | 911.3 | 900.4 | -1.2% |
|  | 70 | 980.3 | 917.5 | -6.4% |
|  | 75 | 979.5 | 921.8 | -5.9% |
|  | 80 | 951.4 | 926.1 | -2.7% |
|  | 85 | 922.8 | 966.0 | 4.7% |
|  | Overall | 937.4 | 915.7 | -2.3% |
| I673L2 | 60 | 1966.1 | 1922.6 | -2.2% |
|  | 65 | 2004.7 | 1989.4 | -0.8% |
|  | 70 | 2078.7 | 1995.3 | -4.0% |
|  | 75 | 2165.4 | 2030.6 | -6.2% |
|  | 80 | 2099.6 | 2012.4 | -4.2% |
|  | 85 | 2131.8 | 2138.2 | 0.3% |
|  | Overall | 2074.4 | 2014.8 | -2.9% |

TABLE 12

HDL-P (μmol/L) % Bias vs. Humidity

| Control Level | Temp (° F.) | Mean @ low humidity | Mean @ high humidity | % Bias |
|---|---|---|---|---|
| I673L1 | 60 | 26.72 | 26.47 | -0.9% |
|  | 65 | 27.34 | 26.98 | -1.3% |
|  | 70 | 28.49 | 27.75 | -2.6% |
|  | 75 | 29.05 | 28.20 | -2.9% |
|  | 80 | 28.88 | 28.57 | -1.1% |
|  | 85 | 28.18 | 29.22 | 3.7% |
|  | Overall | 28.11 | 27.87 | -0.9% |
| I673L2 | 60 | 36.12 | 35.70 | -1.2% |
|  | 65 | 36.60 | 36.32 | -0.8% |
|  | 70 | 37.96 | 37.17 | -2.1% |
|  | 75 | 39.21 | 37.49 | -4.4% |
|  | 80 | 38.92 | 37.92 | -2.6% |
|  | 85 | 38.50 | 40.08 | 4.1% |
|  | Overall | 37.89 | 37.45 | -1.2% |

The % bias associated with humidity was less than 10% for each analyte at each temperature test point. The overall % bias between the two humidity test points was less than 3% for LDL-P, approximately 1% for HDL-P, and almost negligible for TG and HDL-C (<1%).

Additional analysis was performed to investigate the differing relationship between analyte values and environmental temperature for the low humidity and high humidity testing (polynomial and linear relationship, respectively). The difference between the linear and polynomial relationships was most significant at 85 degrees F. resulting in the highest % bias vs. humidity for each analyte at this test point, although humidity in general was found not to be a significant contributor to bias.

Environmental temperature and humidity testing was performed on Vantera over the range of 60-85 degrees F. at both low and high humidity. Test results showed acceptable % bias less than 10% for LDL-P, TG, HDL-C, and HDL-P at each test point with the exception of LDL-P at 60 degrees F. and low humidity. In general, the largest % bias observed across all analytes was at the 60 degrees F. test point at both humidity levels.

Based on regression analysis, environmental temperatures in the range of 61-85 degrees F. produce LDL-P, TG, HDL-C, and HDL-P results within an acceptable 10% bias range relative to those produced at standard ambient temperature of 77 degrees F. (25 degrees C.). Unlike environmental temperature which had a clear relationship with analyte values, humidity was not found to be a significant contributor to bias.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses, where used, are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of operating an NMR analyzer, comprising:
   placing an in vitro biosample in a bore of an NMR spectrometer;
   electronically obtaining NMR signal associated with the sample from an NMR probe held in the bore of an NMR spectrometer;
   electronically detecting at least one temperature at a location that is (i) on-board the NMR analyzer and/or (ii) in a room holding the NMR analyzer proximate in time to the obtaining step; then
   electronically correcting the obtained signal using a temperature sensitivity correction factor that is selected based on the detected temperature and a model of NMR signal temperature sensitivity; and
   generating a quantitative measurement of a sample using the corrected obtained signal
   wherein the model is a model of a concentration standard over a defined temperature range that provides NMR signal intensity adjustment that varies as temperature varies.

2. The method of claim 1, wherein the electronically detecting step is carried out using a temperature sensor that resides in an NMR console of the NMR analyzer, and wherein the electronically detecting step is carried out to detect a plurality of temperatures during the obtaining step.

3. The method of claim 1, wherein the model is a linear or non-linear model of a concentration standard over a defined temperature range that provides NMR signal intensity adjustment that varies as ambient temperature varies thereby allowing for fluctuating ambient temperatures over at least 5 degrees Fahrenheit within the defined ambient temperature range.

4. The method of claim 1, wherein the temperature sensitivity correction factor includes a non-temperature sensitive instrument normalization correction factor to thereby normalize measurements taken over a plurality of different NMR analyzers.

5. The method of claim 1, wherein the electronically detecting step is carried out using at least one temperature sensor that is on-board the NMR analyzer proximate a mixer box.

6. The method of claim 1, wherein the model is generated using a standard model of temperature sensitivity based on measurements of a plurality of different NMR consoles or portions thereof obtained by measuring temperature versus peak values of standard signal integrals over a defined temperature range, with the signal values at defined temperatures over the temperature range being averaged to generate the standard model with a slope.

7. The method of claim 6, wherein the temperature sensitivity measurements are carried out while the NMR analyzers are held in a temperature controlled environment and exposed to temperatures over a defined temperature range.

8. The method of claim 1, wherein data for the model is generated at a use site of a respective NMR analyzer to define an instrument specific slope.

9. The method of claim 1, wherein the model is validated and/or generated, at least in-part, at a use site using a small ambient temperature range that is a sub-range of a defined larger acceptable ambient temperature operating range.

10. The method of claim 1, wherein the obtaining step can be carried out when the NMR analyzer is in a room having an ambient temperature range of between about 63 degrees Fahrenheit to about 75 degrees Fahrenheit with temperatures that can fluctuate at least about +/−5 degrees F. (3 degrees C.) Fahrenheit within the temperature range, and wherein the generating step generates quantitative measurements with +/−2% accuracy as measured by a trimethyl acetic acid (TMA) control.

11. The method of claim 1, wherein the sample is a human blood serum or plasma biosample, wherein the obtaining step can be carried out when the NMR analyzer is in a room having an ambient temperature range of between about 60-85 degrees Fahrenheit with temperatures that can fluctuate at least about +/−5 degrees Fahrenheit within the temperature range, and wherein the generating step generates quantitative measurements with +/−10% accuracy of lipoproteins in the biosample.

12. The method of claim 1, wherein the model is a linear model and has a negative slope, and wherein the correcting step can be carried out using the slope to calculate the adjustment factor, and wherein the detected temperature can include a temperature in a mixer region on-board the NMR analyzer which correlates to an ambient temperature that is between about 10-15 degrees Fahrenheit below the on-board detected mixer temperature.

13. The method of claim 1, wherein the obtaining step can be carried out when the NMR analyzer is in a room having an ambient temperature range of between about 60 degrees Fahrenheit to at least about 80 degrees Fahrenheit with temperatures that can fluctuate at least about +/−10 degrees Fahrenheit.

14. The method of claim 1, wherein the generating step generates quantitative measurements for at least one target analyte in the biosample with about +/−10% accuracy over a temperature range of 60-85 degrees Fahrenheit.

15. The method of claim 1, wherein the sample is a human blood serum or plasma biosample, and wherein the generating step generates a clinically acceptable quantitative measurement for at least one target analyte in the biosample over a temperature range of between about 60-85 degrees Fahrenheit.

16. The method of claim 1, wherein the sample is a human urine biosample, and wherein the generating step generates a clinically acceptable quantitative measurement for at least one target analyte in the biosample over a temperature range of between about 60-85 degrees Fahrenheit.

17. An NMR analyzer, comprising:

an NMR console;

at least one temperature sensor onboard or proximate to the NMR console; and at least one processor in communication with the NMR console configured to apply a post-signal collection temperature sensitivity correction to signal data in communication with or onboard the analyzer, the at least one processor configured to adjust NMR signal intensity associated with an in vitro biosample undergoing analysis using a correction factor that varies with increasing and decreasing ambient temperature based on (i) temperature data from the at least one temperature sensor and (ii) a model of temperature sensitivity of NMR signal intensity of a concentration standard over a defined ambient temperature range that is between at least about 63 degrees Fahrenheit to at least about 75 degrees Fahrenheit, wherein the at least one processor is configured to generate quantitative measurements using the temperature data and the model allowing for fluctuating ambient external temperatures of at least about 5 degrees Fahrenheit proximate the NMR analyzer within the defined ambient temperature range.

18. A circuit comprising at least one processor configured to compensate for temperature sensitivity of at least one NMR analyzer, wherein the circuit is configured to adjust NMR signal intensity of a respective NMR analyzer associated with an in vitro biosample undergoing analysis based on (i) a detected temperature onboard the NMR console proximate in time to the analysis and (ii) at least one model of temperature sensitivity of NMR signal intensity of a concentration standard over a defined ambient temperature range of between at least about 63 degrees Fahrenheit to at least about 75 degrees Fahrenheit, wherein the circuit is configured to generate quantitative measurements using the detected temperature and the at least one model of temperature sensitivity allowing for fluctuating ambient temperatures in an environment about the NMR analyzer over the entire defined ambient temperature range.

19. A processor configured to adjust obtained NMR signal associated with an in vitro biosample using data from at least one defined model of temperature sensitivity of at least one NMR analyzer, the at least one model representing signal intensity versus temperature of a concentration standard over a defined temperature range between at least about 63 degrees Fahrenheit and at least about 75 degrees Fahrenheit, wherein the NMR signal intensity adjustment varies as ambient temperature varies thereby allowing for fluctuating ambient temperatures over at least 5 degrees Fahrenheit within the defined ambient temperature range.

20. A computer program product for adjusting NMR signal intensity to compensate for temperature sensitivity of an NMR analyzer, the computer program product comprising:

a non-transitory computer readable storage medium having computer readable program code embodied in said medium, said computer-readable program code comprising:

computer readable program code configured to adjust NMR signal intensity associated with an in vitro biosample undergoing analysis for temperature sensitivity based on (i) a temperature associated with at least one internal location inside the NMR analyzer or at least one external ambient location associated with the NMR analyzer proximate in time to signal acquisition of a respective biosample and (ii) a model of temperature sensitivity of NMR signal intensity of a concentration standard over a defined ambient temperature range of between at least about 63 degrees Fahrenheit to at least about 75 degrees Fahrenheit, wherein the NMR signal intensity adjustment varies as ambient temperature varies thereby allowing for fluctuating ambient temperatures over at least 5 degrees Fahrenheit within the defined ambient temperature range; and computer readable program code configured to generate quantitative measurements using the adjusted NMR signal intensity.

* * * * *